United States Patent
Shiota

(10) Patent No.: US 9,853,161 B2
(45) Date of Patent: Dec. 26, 2017

(54) THIN FILM TRANSISTOR WITH POLYCRYSTALLINE SEMICONDUCTOR FORMED THEREIN

(75) Inventor: Kunihiro Shiota, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 853 days.

(21) Appl. No.: 12/727,352

(22) Filed: Mar. 19, 2010

(65) Prior Publication Data

US 2010/0244037 A1   Sep. 30, 2010

(30) Foreign Application Priority Data

Mar. 25, 2009   (JP) .................................. 2009-075281

(51) Int. Cl.
| | | |
|---|---|---|
| H01L 29/66 | (2006.01) | |
| H01L 29/78 | (2006.01) | |
| G02F 1/1368 | (2006.01) | |
| H01L 29/786 | (2006.01) | |
| G02F 1/1345 | (2006.01) | |

(52) U.S. Cl.
CPC ...... *H01L 29/78618* (2013.01); *G02F 1/1368* (2013.01); *H01L 29/66757* (2013.01); *H01L 29/78609* (2013.01); *H01L 29/78675* (2013.01); *G02F 1/13454* (2013.01); *G02F 2202/104* (2013.01)

(58) Field of Classification Search
CPC ..... H01L 29/66; H01L 29/78; G02F 1/13454; G02F 1/1368
USPC ..... 257/66, 72, E21.413, E29.293, E33.053; 438/166
See application file for complete search history.

(56) References Cited

U.S. PATENT DOCUMENTS

| | | | | |
|---|---|---|---|---|
| 5,973,369 | A * | 10/1999 | Hayashi | .................. H01L 21/84 257/369 |
| 6,288,413 | B1 * | 9/2001 | Kamiura et al. | ................. 257/66 |
| 8,198,652 | B2 | 6/2012 | Ando et al. | |
| 8,466,495 | B2 | 6/2013 | Ando et al. | |
| 2004/0023446 | A1 * | 2/2004 | Fujimura | .......... H01L 29/66757 438/149 |
| 2004/0082195 | A1 * | 4/2004 | Yudasaka | .............. H01L 21/288 438/782 |

(Continued)

FOREIGN PATENT DOCUMENTS

| | | |
|---|---|---|
| CN | 101416290 | 4/2009 |
| JP | 11-345978 | 12/1999 |

(Continued)

OTHER PUBLICATIONS

Machine Translation of JP 2003197631 A.*
Chinese Official Action, 201010149400.0, dated Jul. 15, 2013.

*Primary Examiner* — Ori Nadav
*Assistant Examiner* — Vernon P Webb
(74) *Attorney, Agent, or Firm* — Young & Thompson

(57) ABSTRACT

A thin film transistor (TFT) is provided which is capable of reducing leakage currents in a polycrystalline silicon TFT without causing an increase in manufacturing processes. Source/drain regions of an activated layer of the TFT to be formed in a circuit region and pixel region formed on a glass substrate of a liquid crystal display panel for a mobile phone is formed so that its boron impurity falls within a range of $2.5 \times 10^{18}/cm^3$ to $5.5 \times 10^{18}/cm^3$ and its impurity activation falls within a range of 1% to 7%.

7 Claims, 22 Drawing Sheets

(56) References Cited

U.S. PATENT DOCUMENTS

2004/0206956 A1* 10/2004 Yanai et al. .................. 257/59

FOREIGN PATENT DOCUMENTS

| JP | 3143102 | 12/2000 | |
|----|---------|---------|---|
| JP | 2003-197631 | 7/2003 | |
| JP | 2003197631 A * | 7/2003 | ........... H01L 21/336 |
| JP | 2005-223347 | 8/2005 | |
| JP | 3937956 | 4/2007 | |

* cited by examiner (I-4)

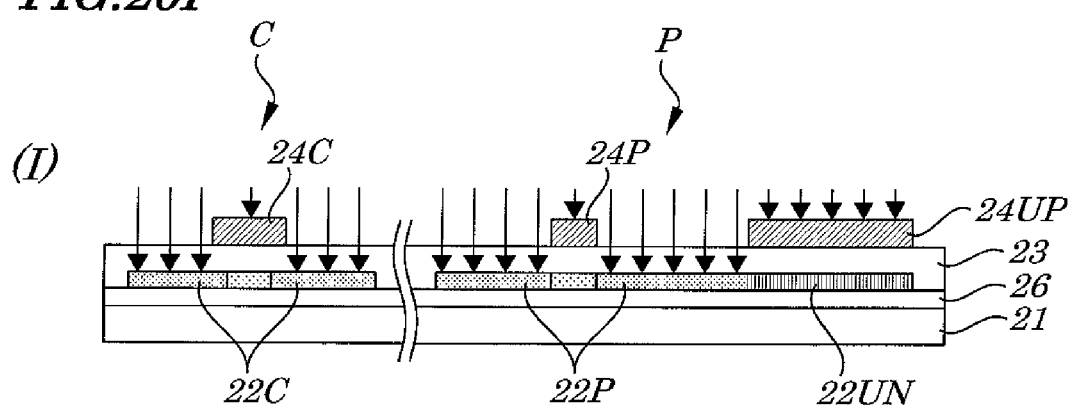
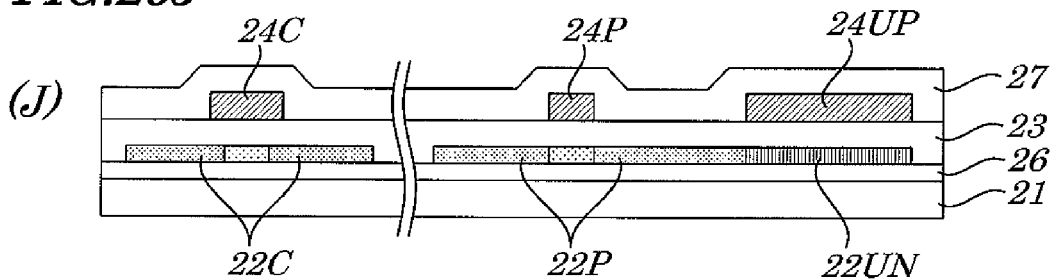

THIN FILM TRANSISTOR WITH POLYCRYSTALLINE SEMICONDUCTOR FORMED THEREIN

INCORPORATION BY REFERENCE

This application is based upon and claims the benefit of priority from Japanese Patent Application No. 2009-075281, filed on Mar. 25, 2009, the disclosure of which is incorporated herein in its entirely by reference.

BACKGROUND OF THE INVENTION

Field of the Invention

The present invention relates to a thin film transistor, a method for manufacturing the same, and a liquid crystal display panel and an electronic device using the same and more particularly to the thin film transistor suitably using a polycrystalline silicon as its semiconductor layer, the method for manufacturing the same, and the liquid crystal display panel and the electronic device using the thin film transistor.

Description of the Related Art

A semiconductor is used in a variety of technological applications and, for example, a thin film transistor (hereinafter simply, a "TFT") using semiconductors makes up a pixel region and a driver circuit region of a liquid crystal display panel, thus contributing to improvement of display image quality and to thinning of the liquid crystal display panel.

The TFT of this type, for example, a p-Si (polycrystalline silicon) TFT, as shown in FIG. 22, when employed as a switching element of a liquid crystal display panel in a pixel region P for displaying pixels and in a circuit region C for driving elements, is formed on an insulating substrate such as a glass substrate 100. Generally, after a silicon oxide film is deposited first, as a backing insulating film 101, on the glass substrate 100, an a-Si (amorphous silicon) thin film is formed on the silicon oxide film and is crystallized to form a polycrystalline silicon thin film. Then, by performing etching process on the polycrystalline silicon thin film, active layers 102 of the TFT, which are activated in a post-process stage, are formed. After the formation of a gate insulating film 103 on the active layers 102 of the TFT, a gate electrode 104 made of metal, polycrystalline silicon, or the like is formed to obtain a basic structure of the TFT.

Next, an impurity is doped (or dosed) into the active layers 102 of the TFT by using the gate electrode 104 as a mask so that the impurity concentration therein becomes $1 \times 10^{20}/cm^3$. Thereafter, an annealing process is performed thereon to activate the impurity so that an activation rate of the doped impurity ordinarily becomes several tens of percent to form a source region (electrode) on one end of the active layer 102 and a drain region (electrode) on the other end of the active layer 102. Then, on the gate insulating film 103 and gate electrode 104 (including unillustrated gate wirings) is formed an interlayer insulating film 105. Next, by forming contact holes 107a passing through the interlayer insulating film 105 and the gate insulating film 103 on both sides of the gate electrode 104 to form wirings 107 (source and/or drain wirings) electrically connected to the active layers 102 (source and/or drain regions). Moreover, in FIG. 22, a pixel electrode 111 made of ITO (indium tin oxide), an orientation film 112, a liquid crystal layer 113, and a common electrode 114 also made of ITO (indium tin oxide) are shown.

In the polycrystalline silicon TFT having such a single drain structure as described above, large amounts of off-leakage currents flow even in an OFF state of the TFT and, therefore, if the above polycrystalline silicon TFT is used as a transistor for switching of a driver circuit or pixel of the liquid crystal display panel or the like, the reduction of the off-leakage currents is necessary. Especially, in the pixel region P where the above TFT is used as a pixel transistor, if the amount of the off-leakage currents is large, a malfunction occurs that electric charges cannot be held which causes a decrease in storage capacitance and degradation in display image quality. The off-leakage currents occur due to tunneling in a P-N junction at an end of the drain and, in the case of polycrystalline silicon, due to the existence many gap levels, tunneling occurs easily.

To solve such problems in the polycrystalline silicon TFT, various measures for the reduction of the off-leakage currents have been proposed. A method is disclosed in, for example, Japanese Patent No. 3143102 (Patent Reference 1), in which an off-leakage current is reduced by lowering impurity concentration in source/drain regions to raise a potential barrier through which a carrier tunnels, that is, to relax the concentration of an electric field. Another method is disclosed in Japanese Patent No. 3937956 (Patent Reference 2) in which, in addition to the lowering of impurity concentration in source/drain regions to reduce the off-leakage currents, an ON-current is surely obtained by raising the impurity concentration only in the region directly under a contact hole formed for connection of wirings in source/drain regions. Still another method is disclosed in Japanese Patent Application Laid-open No. Hei 11-345978 (Patent Reference 3) in which an off-leakage current is reduced by interposing an intermediate concentration region between a high impurity concentration region and a low impurity concentration region in source/drain regions to form an excellent junction and generate effective potential barrier. Still another method is disclosed in Japanese Patent Application Laid-open No. 2005-223347 (Patent Reference 4) in which, in addition to the lowering of an impurity concentration in source/drain regions, an off-leakage current is reduced by implanting a hydrogen ion into source/drain regions so that the impurity concentration falls within a range of $6.0 \times 10^{18}/cm^3$ to $1.0 \times 10^{20}/cm^3$. Still another method is disclosed in Japanese Patent Application Laid-open No. 2003-197631 (Patent Reference 5) in which an off-leakage current is reduced not by lowering impurity concentration but by applying high-energy flash light or high-energy laser light to source/drain regions to form a highly activated region having a high impurity activation rate of 10% to 100%. Moreover, in the above Patent Reference 5, a method of forming a low activated region having a low impurity activation rate of less than 10% is also described, however, the low activated region is simply interposed between highly activated regions functioning as the source/drain regions and, as a result, the formation of the low activated region does not contribute to the reduction in the off-leakage currents.

However, the TFTs described in the above Patent References 1 to 5 have disadvantages in that the off-leakage current can be reduced in a dark state of the TFT, however, while the TFT is being exposed to light, sufficient reduction in the off-leakage current is impossible. Moreover, the off-leakage current flowing while the TFT is being exposed to light is hereinafter called a "light leakage current". Therefore, the use of such TFTs as a switching element in a pixel region of a liquid crystal display panel causes the degradation in display image quality.

The TFT disclosed in the Patent Reference 2 also has a disadvantage in that, in addition to the process of doping impurities into the source/drain regions, processes of doping impurities in a high concentration through contact holes formed for wiring connection in the source/drain regions are required, thus causing a rise in manufacturing costs and a decrease in yield. Similarly, the TFT disclosed in the Patent Reference 3 has a disadvantage in that the process of doping impurities is required at every time when the intermediate impurity concentration region is formed between the high impurity concentration region and low impurity concentration region in the source/drain regions, which also causes a rise in manufacturing costs and a decrease in yield.

The TFT disclosed in the Patent Reference 4 also has a disadvantage in that the process of not additionally doping impurities but newly doping hydrogen ions is required, also causing a rise in manufacturing costs and a decrease in yield.

Further, the TFT disclosed in the Patent Reference 5 has a disadvantage in that the process of not additionally doping impurities but applying high-energy light by spending considerable time is required, as a result, causing a rise in manufacturing costs and a decrease in yield.

SUMMARY OF THE INVENTION

In view of the above, it is an object of the present invention to provide a TFT capable of reducing an off-leakage current in a polycrystalline silicon TFT without causing an increase in processes, a method for manufacturing the TFT, and a liquid crystal display panel and an electronic device using the TFT.

According to an aspect of the present invention, there is provided a thin film transistor including a polycrystalline semiconductor layer formed on a substrate, agate electrode formed on the semiconductor layer with a gate insulating film interposed between the semiconductor layer and the gate electrode, and source/drain regions doped with an impurity formed in the semiconductor layer with the gate electrode being sandwiched between the source/drain regions, wherein the impurity concentration in the source/drain regions is set to fall within a range of $2.5 \times 10^{18}/cm^3$ to $5.5 \times 10^{18}/cm^3$ and the activation rate of the impurity contained in the source/drain regions is set to fall within 1% to 7%.

With the above configuration, it is made possible to reduce an off-leakage current of the TFT not only in a dark state, but also in a case of light irradiation (the off-leakage current in a case of light irradiation is referred to as the light leak current). Therefore, when the TFT is used as a switching element in a pixel region of the liquid crystal display panel, the degradation in display image quality can be avoided.

BRIEF DESCRIPTION OF THE DRAWINGS

The above and other objects, advantages, and features of the present invention will be more apparent from the following description taken in conjunction with the accompanying drawings in which:

FIG. 14A is a graph showing a relation between a number of gate electrodes and light leakage current, and FIG. 14B is a graph showing a relation between a number of gate voltages and a light leakage current;

FIGS. 20I and 20J are process diagrams showing the manufacturing method following the processes in FIG. 19H;

DETAILED DESCRIPTION OF THE PREFERRED EXEMPLARY EMBODIMENTS

Figure 1:
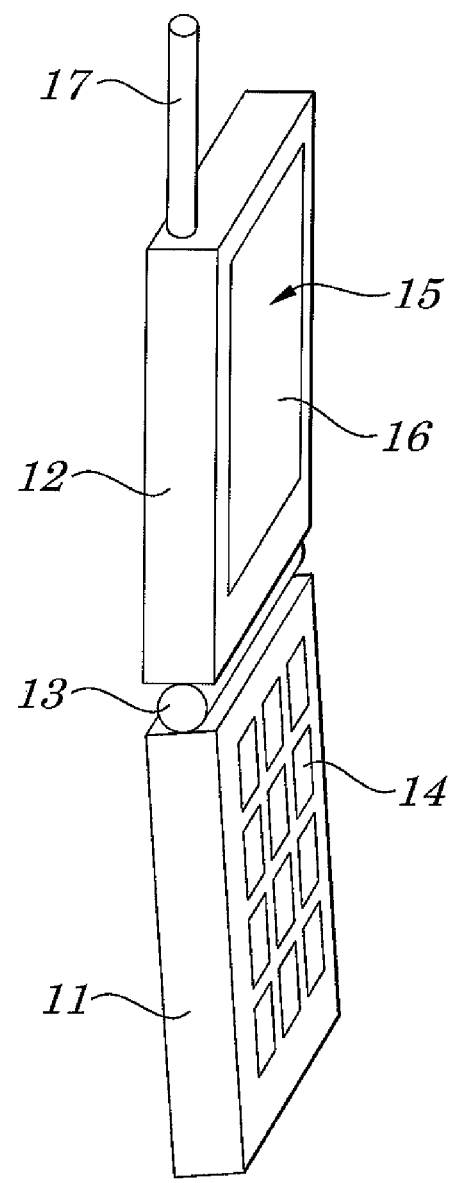
FIG. 1 is a perspective view of a mobile phone having a liquid crystal display panel according to a first exemplary embodiment of the present invention.

Best modes of carrying out the present invention will be described in further detail using various exemplary embodiments with reference to the accompanying drawings.

A TFT is provided which has a polycrystalline silicon film formed on a substrate, a gate electrode formed on the polycrystalline silicon film with a gate insulating film interposed therebetween, source/drain regions formed by doping impurities into the polycrystalline silicon film with the gate electrode interposed therebetween. In the source/drain regions of the TFT, boron or phosphorus is doped into regions, at least, from an end portion of a gate wiring to a region directly under a contact hole so that its impurity concentration falls within a range of 2.5 ×10$^{18}$/cm$^3$ to 5.5×10$^{18}$/cm$^3$ and an activation rate of the impurity contained in the source/drain regions is within a range of 1% to 7%, preferably 1% to 5%.

Here, the activation rate of an impurity is a rate of a number of impurities contributing to generation of carriers to a total number of impurities doped in a silicon film and, therefore, can be calculated from a value of sheet resistance. That is, when the value of sheet resistance is ρs, there is a relation shown by the following equation (1) between the value ρs and impurity concentration p and the symbol A in the equation (1) indicates the impurity activation rate and, by changing the equation (1), the impurity activation rate A can be derived from the following equation (2). Moreover, the impurity concentration p can be quantified by secondary ion mass spectrometry (SIMS) and an actually measured value or reference value can be used as other parameters.

$$\rho s = ((1/(q \cdot p \cdot \mu)/t) \times A \qquad (1)$$

$$A = \rho s \cdot q \cdot p \cdot \mu \cdot t \qquad (2)$$

where ρs denotes a value of sheet resistance, q denotes an elementary charge 1.602×10$^{-19}$ (C), p denotes impurity concentration, μ denotes mobility, t denotes a silicon thickness, and A denotes an impurity activation rate.

Moreover, the impurity activation rate, since it is a ratio of a number of carriers to a number of impurity elements, if the measurement of a value of sheet resistance is difficult, can be derived from impurity concentration p that can be quantified by the SIMS and from carrier concentration that can be quantified by using a scanning capacitance microscope (SCM). The SIMS is a method for performing a mass spectrometry analysis for quantification on an ion (secondary ion) of a constituent substance of a sample sputtered from a surface of the sample by irradiation of an ion beam (primary ion beam) at an accelerated voltage of several keV to several tens of keV. The SCM is equipment to measure a capacitance on a sample surface by using a probe chip and, in a semiconductor field, the quantification of carrier concentration by the measurement of a depletion layer formed by probing is a generally applied method. There is a relation shown by the following equation (3) between a depletion layer thickness dm and carrier concentration Na and the rate (Na/p) of Na in the equation (3) to impurity concentration p obtained from the SIMS analysis is the impurity activation rate A.

$$dm = (4Ås \cdot k \cdot T \cdot (\ln(Na/ni)/q2Na))^{1/2} \qquad (3)$$

where dm denotes a saturation width of a depletion layer, Na denotes carrier concentration, Ås denotes a dielectric constant of a semiconductor, k denotes the Boltzman constant, T denotes a temperature, ni denotes intrinsic carrier concentration and q denotes a charge of a carrier.

The above two methods of calculating the impurity activation rate A partially differ in that the number of carriers is calculated from a value of sheet resistance or the number of carriers are directly measured and are the same in that a ratio of a carrier to impurity concentration is calculated.

Hereinafter, exemplary embodiments of the present invention are described by referring to drawings.

First Exemplary Embodiment

Figure 2:
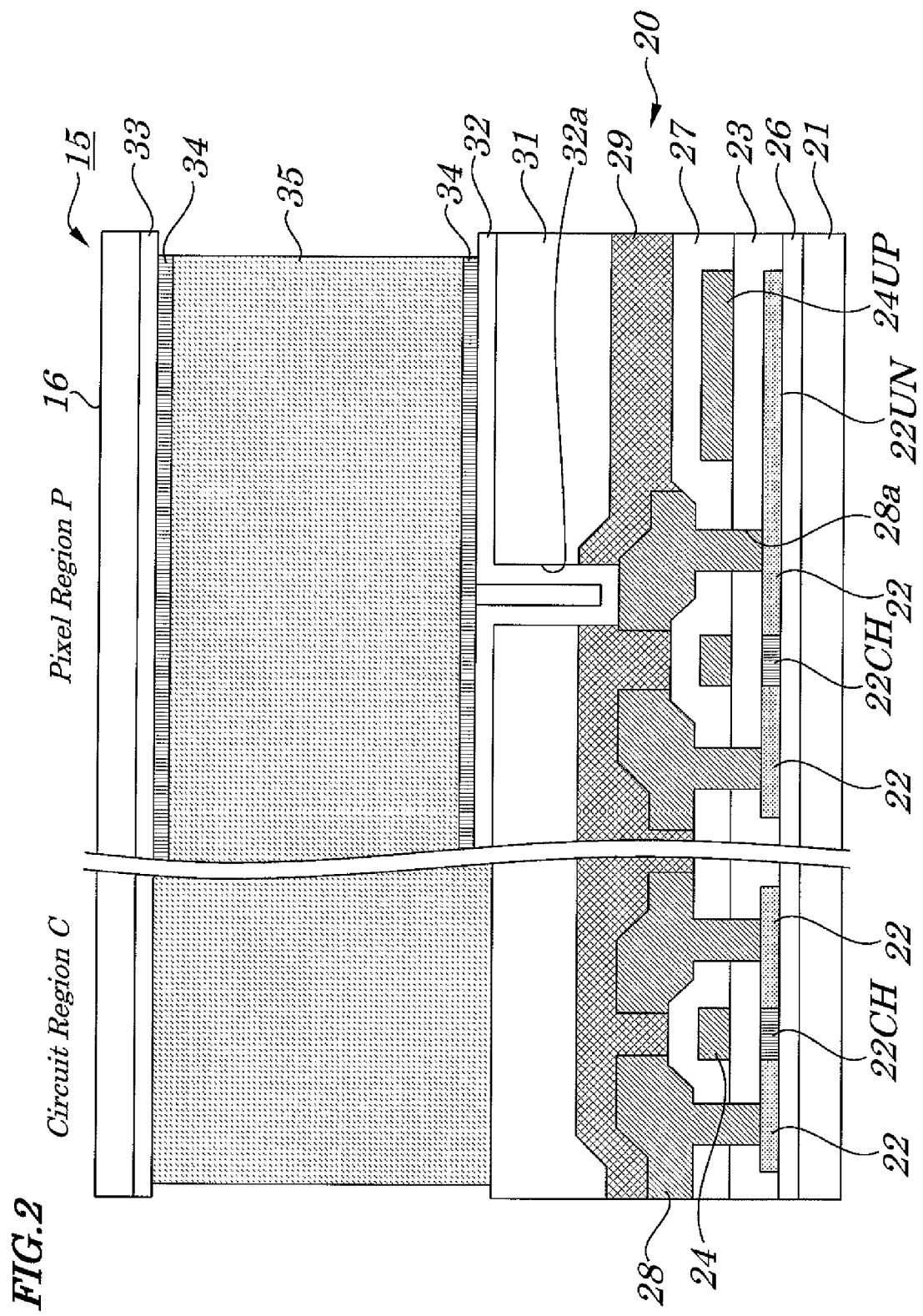
FIG. 2 is a partially expanded longitudinal sectional view of a TFT mounted on the liquid crystal display panel according to the first exemplary embodiment.
Figure 3:
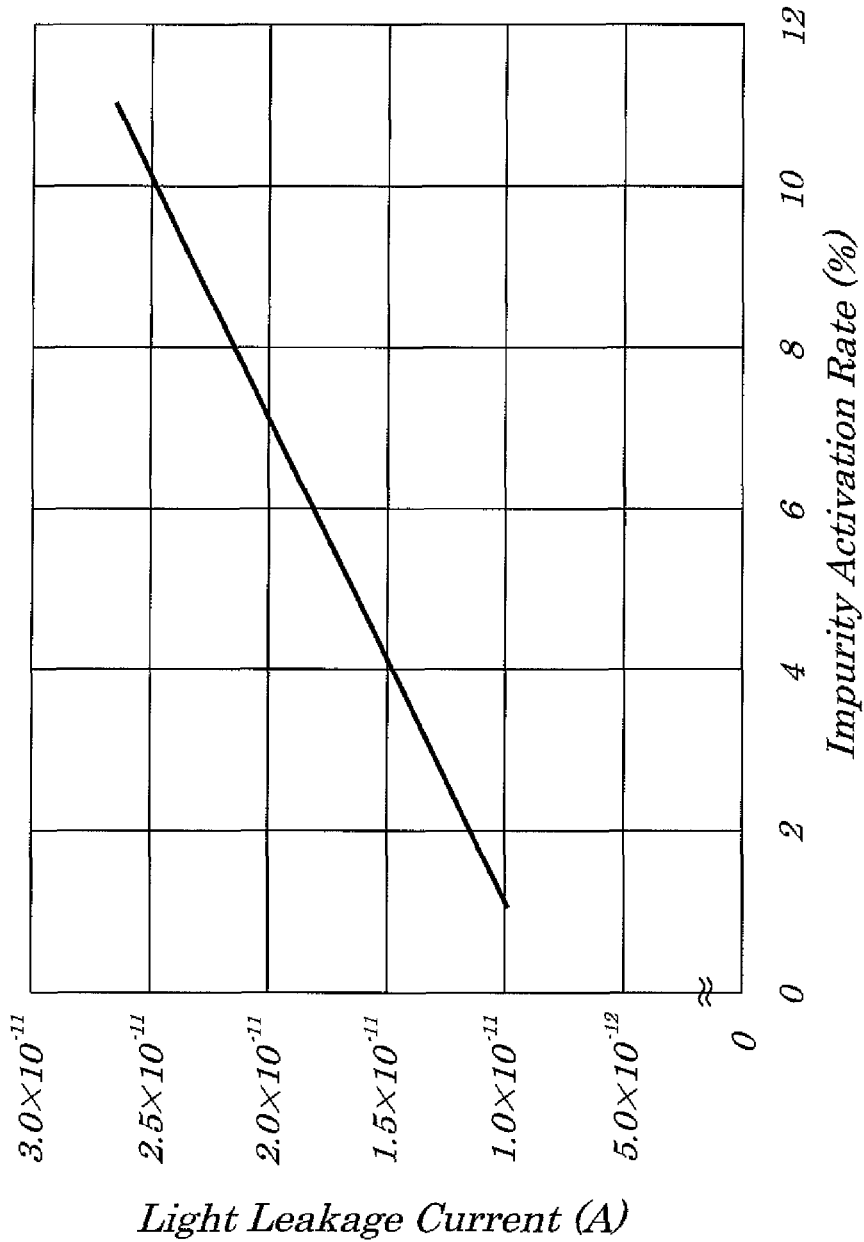
FIG. 3 is a graph showing a relation between an impurity activation rate and a light leakage current in source/drain regions in the TFT according to the first exemplary embodiment.
Figure 4:
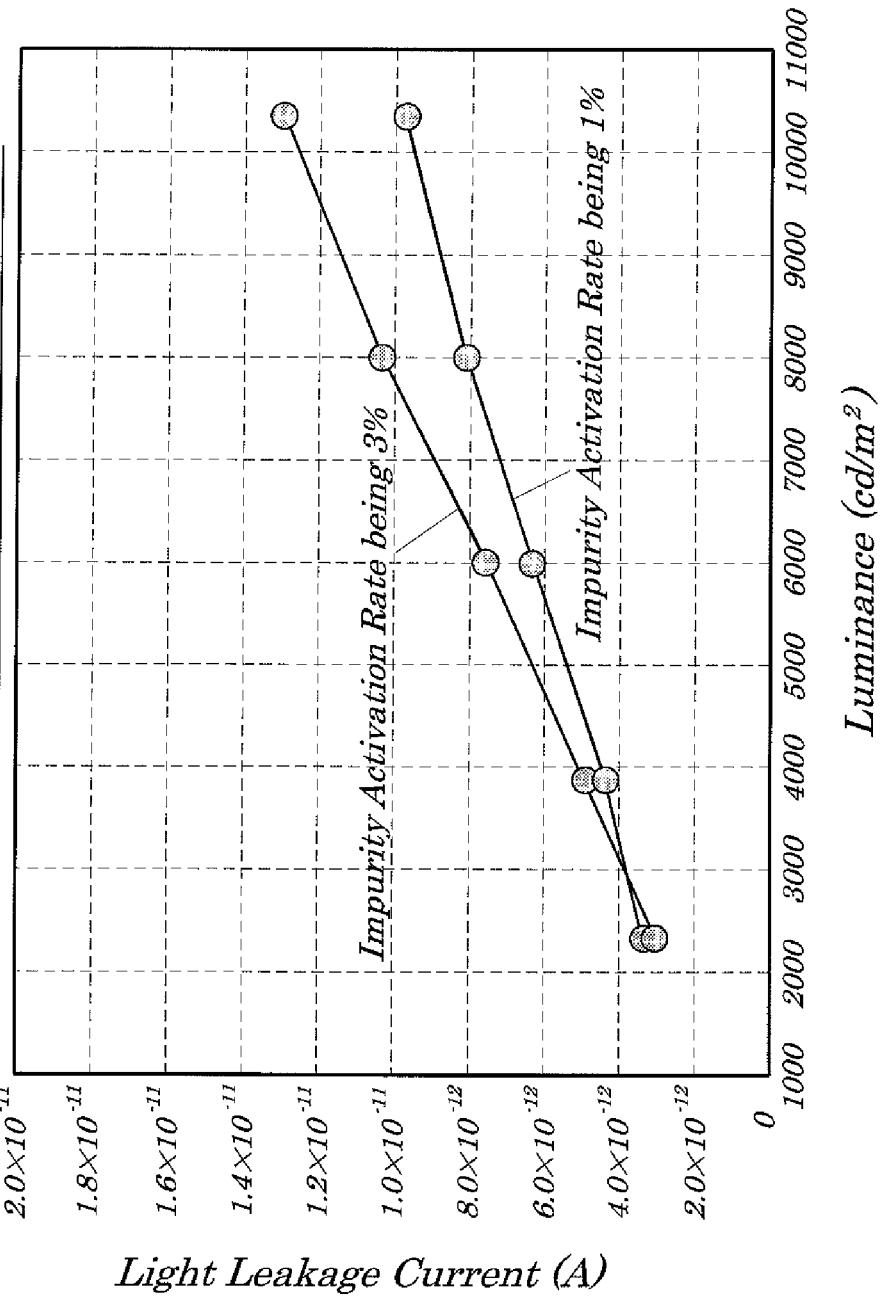
FIG. 4 is a graph showing a relation between luminance at different impurity activation rates and a light leakage current in source/drain regions in the TFT according to the first exemplary embodiment.
Figure 5:
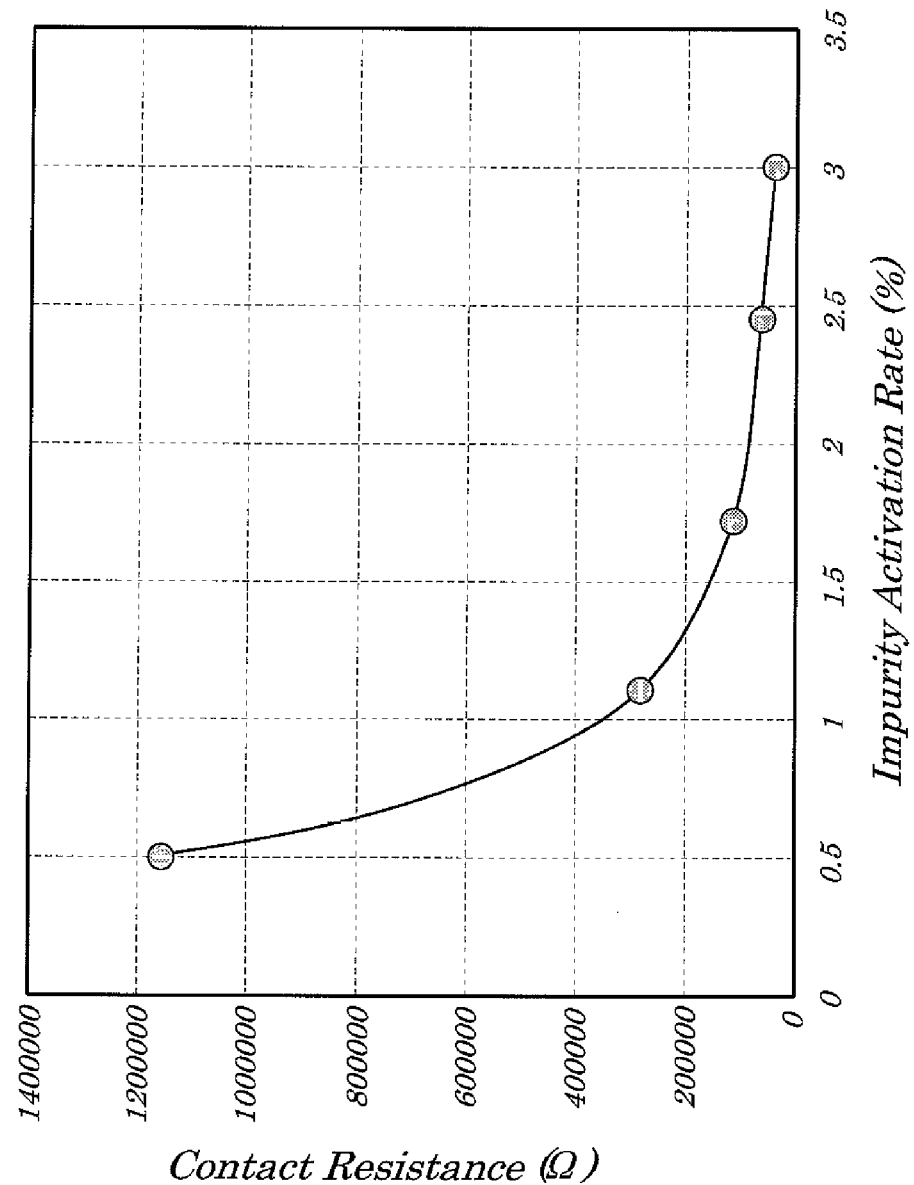
FIG. 5 is a graph showing a relation between an impurity activation rate and contact resistance in the source/drain regions in the TFT according to the first exemplary embodiment.
Figure 6:
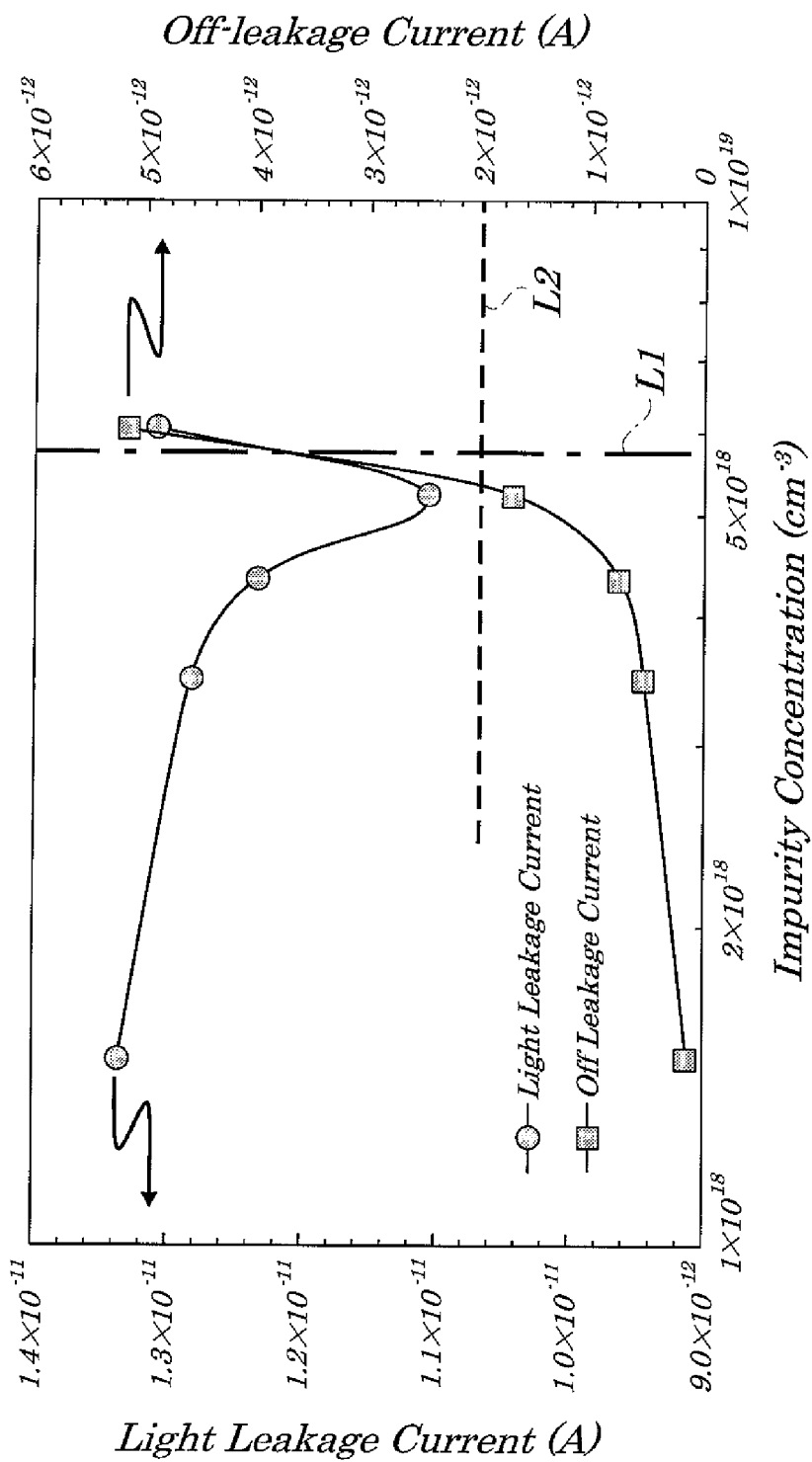
FIG. 6 is a graph showing a relation among an impurity activation rate, off-leakage current, and light leakage current in the source/drain regions in the TFT according to the first exemplary embodiment.
Figure 7:
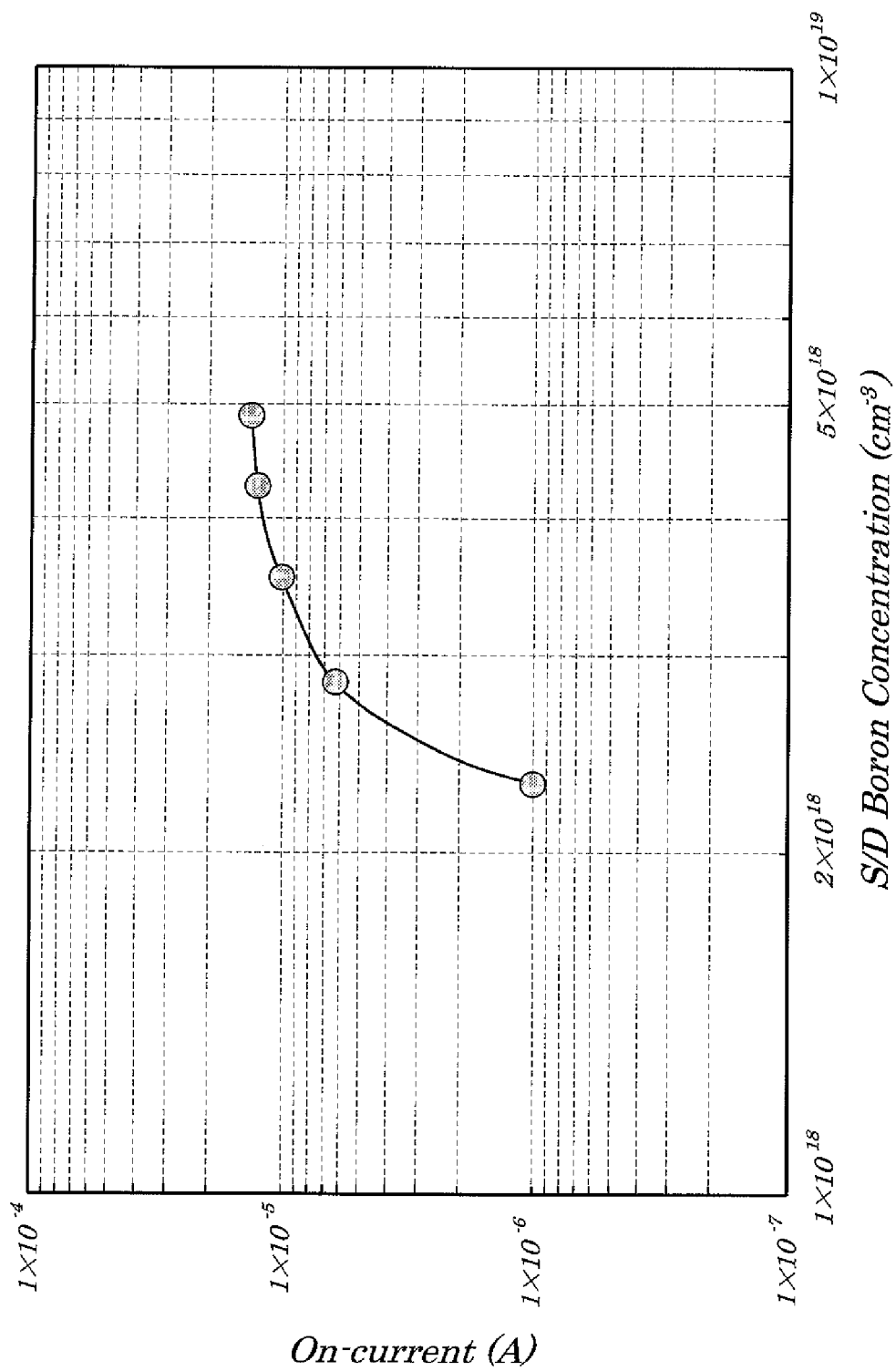
FIG. 7 is a graph showing a relation between S/D (source/drain) boron concentration being one example of impurities and an ON-current in the source/drain regions in the TFT according to the first exemplary embodiment.
Figure 11N:
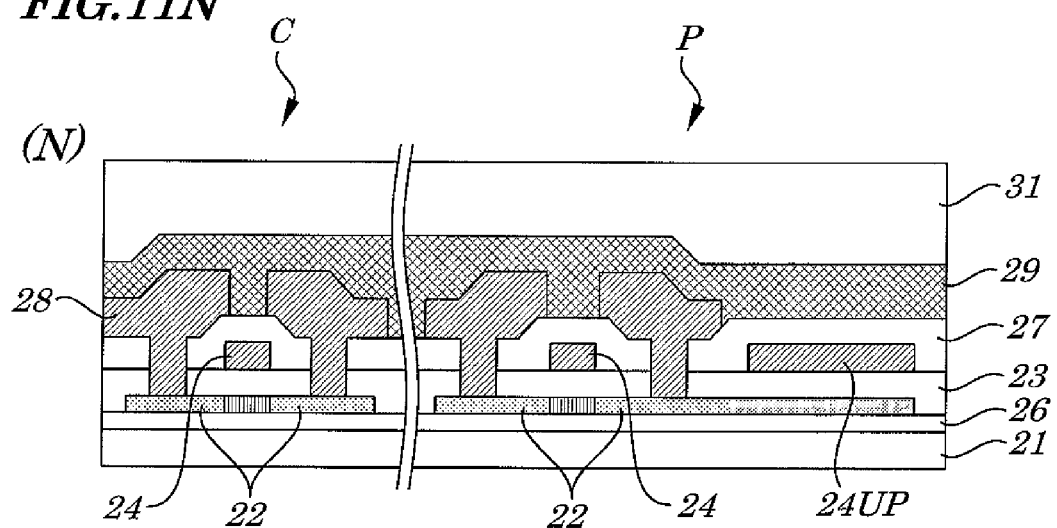
FIGS. 11N, 11O, and 11P are diagrams showing the method of manufacturing the TFT following the methods in FIG. 10M according to the first exemplary embodiment of the present invention.
Figure 11O:
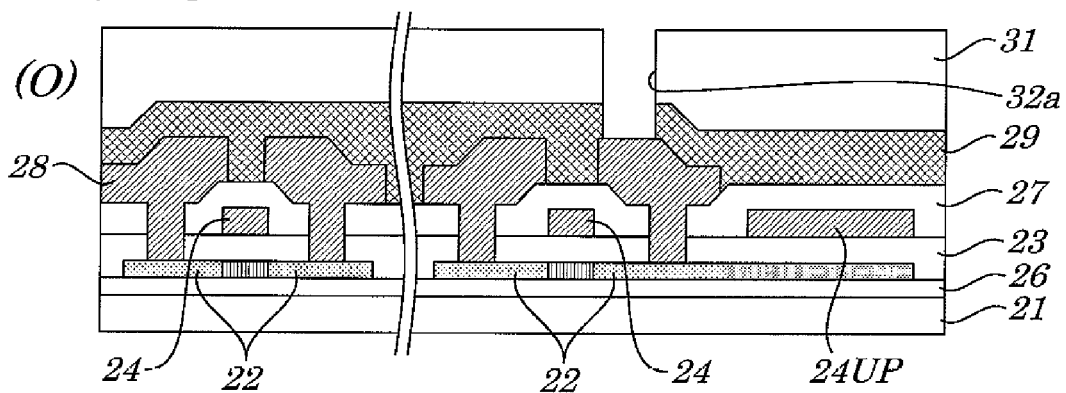
Figure 11P:
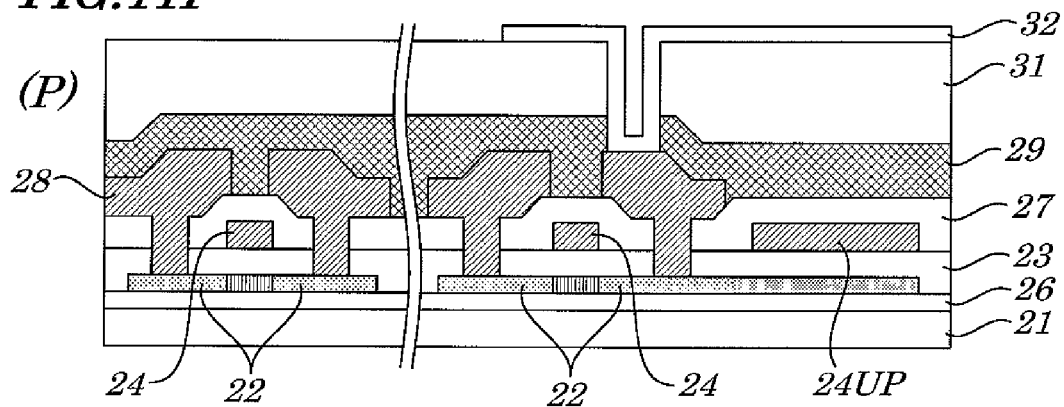
Figure 12:
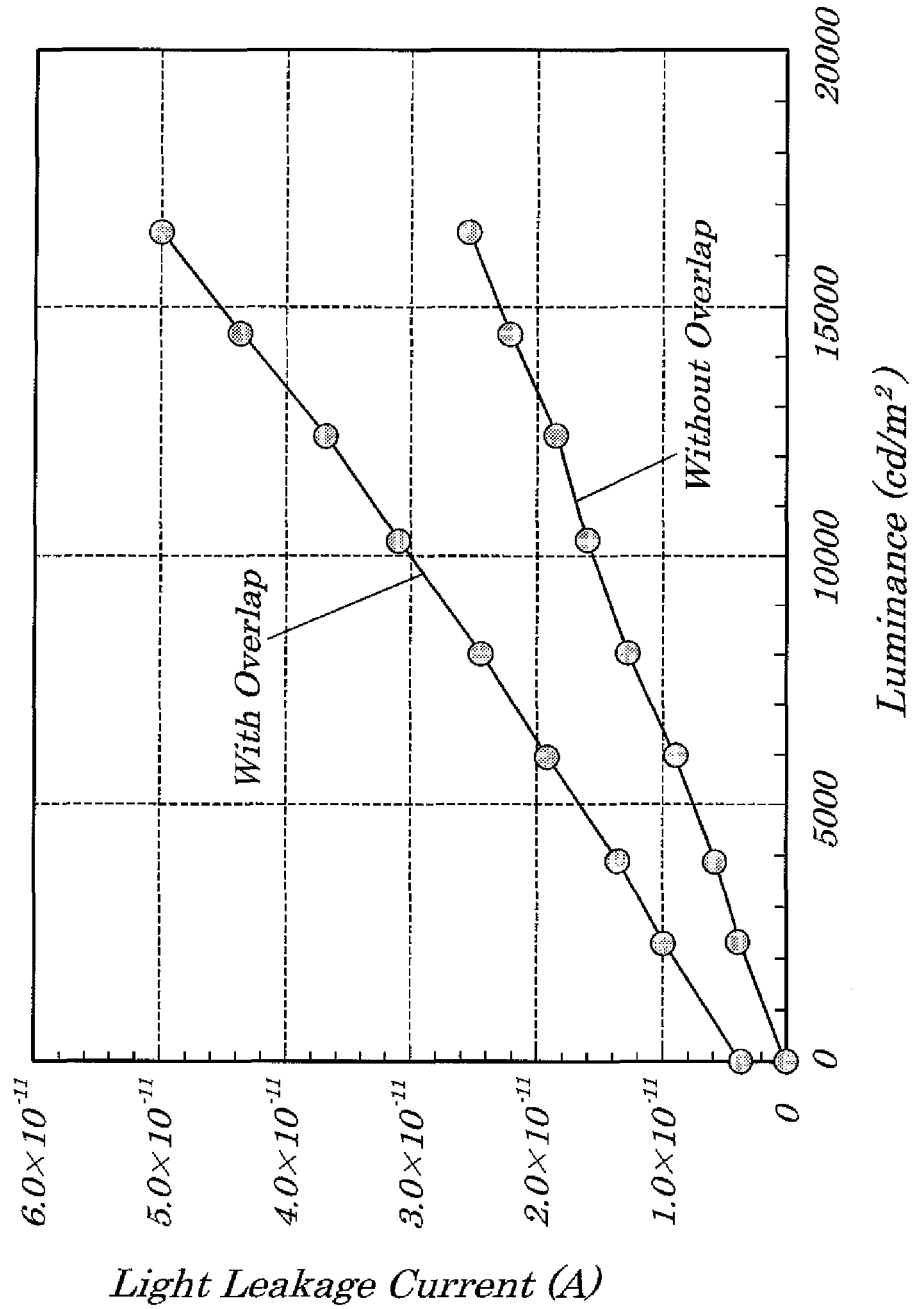
FIG. 12 is a graph showing a relation between luminance and light leakage current in the source/drain regions in the TFT according to the first exemplary embodiment of the present invention.
Figure 13:
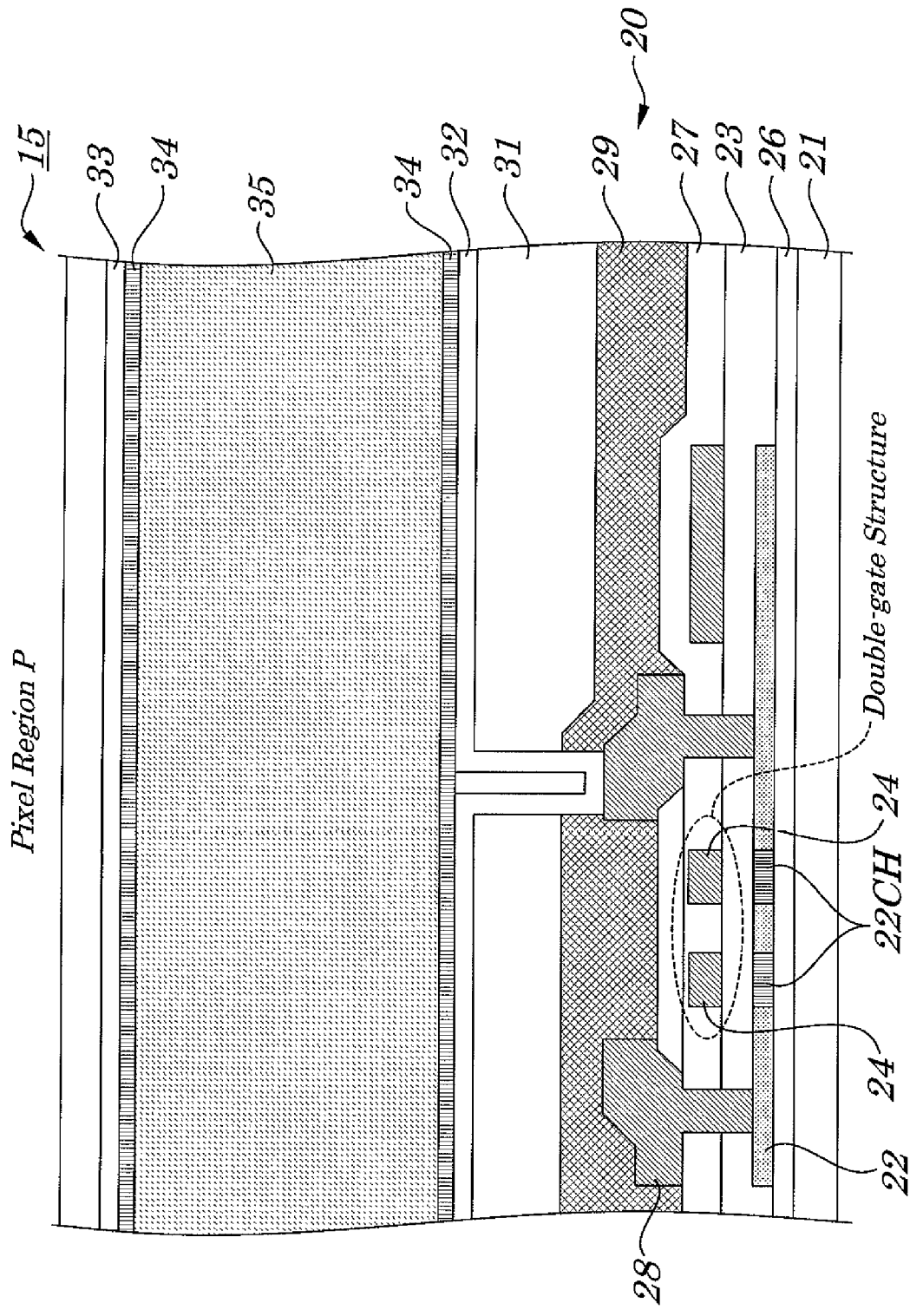
FIG. 13 is a longitudinal sectional view of a multi-gate structure (double-gate structure) explaining effects of the TFT according to the first exemplary embodiment of the present invention.
Figure 14A:
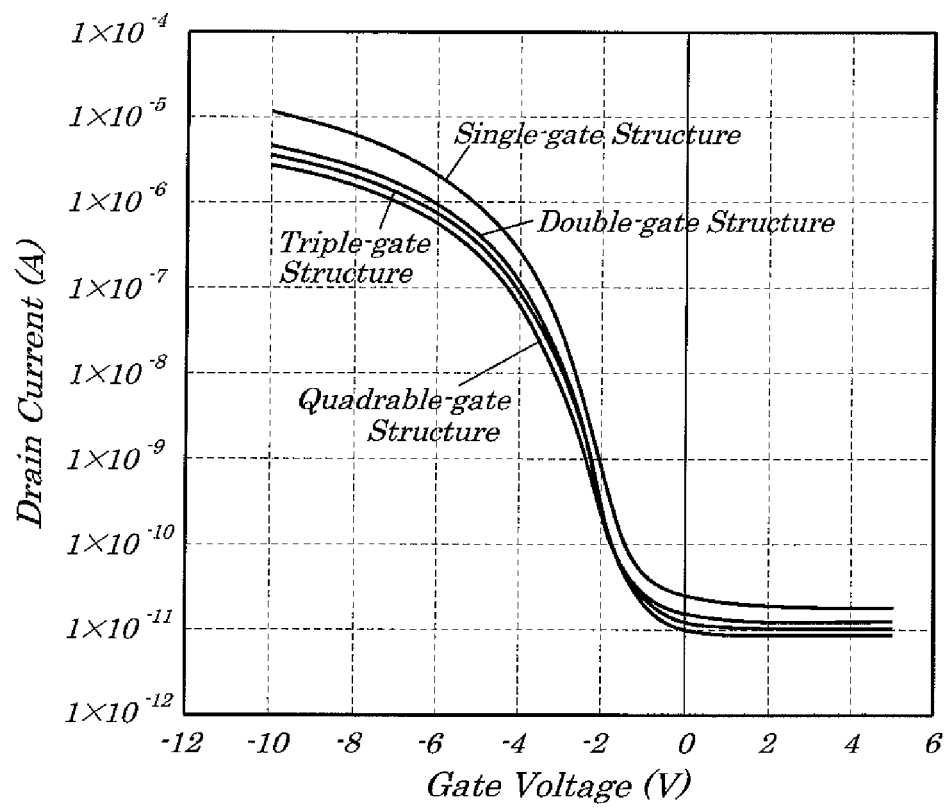
FIGS. 14A and 14B are graphs showing effects of the multi-gate structure.
Figure 14B:
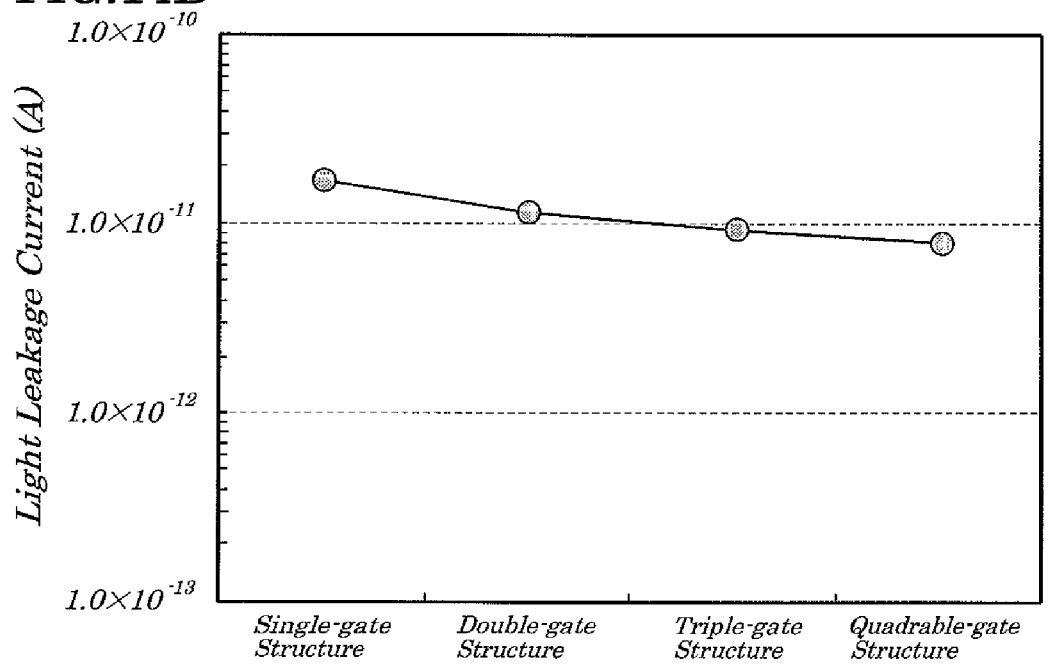

FIG. 1 is a perspective view of a mobile phone having a liquid crystal display panel of the first exemplary embodiment of the present invention. FIG. 2 is a partially expanded longitudinal sectional view of a TFT mounted on the liquid crystal display panel of the first exemplary embodiment. FIG. 3 is a graph showing a relation between an impurity activation rate and a light leakage current in source/drain regions in the TFT of the first exemplary embodiment. FIG. 4 is a graph showing a relation between luminance at different impurity activation rates and a light leakage current in source/drain regions in the TFT of the first exemplary embodiment. FIG. 5 is a graph showing a relation between an impurity activation rate and contact resistance in source/drain regions in the TFT of the first exemplary embodiment. FIG. 6 is a graph showing a relation between an impurity activation rate and an off-leakage current and light leakage current in source/drain regions in the TFT of the first exemplary embodiment. FIG. 7 is a graph showing a relation between S/D boron concentration being one example of impurities and an ON-current in source/drain regions in the TFT of the first exemplary embodiment. FIGS. 8A, 8B, 8C, 8D, and 8E are diagrams showing the method of manufacturing the TFT of the first exemplary embodiment. FIGS. 9F, 9G, 9H, and 9I are also diagrams showing the method of manufacturing the TFT following the methods shown in FIGS. 8A, 8B, 8C, 8D, and 8E of the first exemplary embodiment. FIGS. 10J, 10K, 10L, and 10M are diagrams showing the method of manufacturing the TFT following the methods shown in FIGS. 9F, 9G, 9H, and 9I of the first exemplary embodiment. FIGS. 11N, 11O, and 11P are diagrams showing the method of manufacturing the TFT following the methods shown in FIGS. 10J, 10K, 10L, and 10M of the first exemplary embodiment. FIG. 12 is a graph showing a relation between luminance and a light leakage current in source/drain regions in the TFT of the first exemplary embodiment. FIG. 13 is a longitudinal sectional view of a multi-gate structure (double-gate structure) explaining effects of the TFT of the first exemplary embodiment. FIGS. 14A and 14B are diagrams showing the effects of the multi-gate structure and FIG. 14A is a graph showing a relation between a number of gate voltages and a light leakage current of the first exemplary embodiment and FIG. 14B is a graph showing a relation between a number of gate voltages and a light leakage current. FIG. 15 is a graph showing a relation between a number of gate electrodes and drain currents corresponding to presence or absence of an overlapped portion explaining the effects of the multi-gate structure of the first exemplary embodiment.

As shown in FIG. 1, the mobile phone (electronic device) of the first exemplary embodiment is configured so that its operation enclosure case 11 and its display enclosure case 12 are formed to have an approximately same shape of a thin box and to relatively pivot around a hinge 13 in facing and parting directions. That is, the mobile phone is constructed to be of a clamshell shape. The operation enclosure case 11 has a various kinds of operation keys 14 arranged on a side facing the display enclosure case 12 and makes up of an operation portion and also has an unillustrated embedded microphone, making up a microphone side enclosure. On the other hand, the display enclosure case 12 has a liquid crystal display panel 15 whose display screen 16 is disposed on a side facing the operation enclosure case 11 and has an unillustrated embedded speaker making up an enclosure on a receiver side. The liquid crystal display panel 15 includes a pixel switching element made up of the TFT described later and placed in a pixel region and of a driver circuit to drive the switching element mounted in a circuit region adjacent to the pixel switching element. The liquid crystal display panel 15, by activating a liquid crystal by the TFT 20 formed for every pixel and by using backlight transmitted through the pixel region, displays, in color, operational input information from the operation key 14 and various information received through an antenna 17 on the display screen 16. Here, configurations of the mobile phone of the present exemplary embodiment are schematically shown in FIG. 1.

In the liquid crystal display panel 15, as shown in FIG. 2, an activated layer 22 made of polycrystalline silicon is formed on a glass substrate 21. In the activated layer 22 are formed a channel region directly under a gate electrode 24, the source region (electrode) at its one end and the drain region (electrode) at its another end. On the activated layer 22 is formed a gate insulating film 23 made of a silicon oxide film and on the gate insulting film 23 is further formed the gate electrode 24. Thus, a TFT 20 making up the pixel switching element in the pixel region P and the driver circuit in the circuit region C is formed thereon. In the TFT 20, a storage capacitance lower electrode 22UN constructed by extending the drain region (electrode) of the activated layer 22 on the pixel region P side is formed and, in addition to the gate electrode 24, a storage capacitance upper electrode 24UP disposed in a place facing the storage capacitance lower electrode 22UN is formed which provides a structure to store electric charges needed to function as the pixel switching element. The gate electrodes 24 are arranged in a matrix form, which allows a plurality of the gate electrodes 24 to be formed in parallel to one another and to be connected to a common gate wiring. Moreover, the activated layers 22, as described later, are formed by a self-alignment method using each of the gate electrodes 24 as a mask that can eliminate the need for mask alignment. The region interposed between the source and drain regions where impurities are not doped and no activation occurs is used as a channel region 22CH.

The liquid crystal display panel 15 includes, in addition to the activated layer 22 in the source/drain regions, the gate insulating film 23, the and gate electrode 24, all of which make up the TFT 20, a backing protective film 26 made of a silicon oxide film and formed on a surface of the glass substrate 21 to prevent pollution caused by penetration and invasion of impurities, a first interlayer insulating film 27 made of a silicon oxide film and formed so as to cover entire portions including the gate insulating film 23 formed on an opposite side and gate wiring (not shown) formed on an upper side of the gate electrode 24, an S/D (source/drain) wiring 28 housed in each of contact holes 28a being opened so as to pass through the first interlayer insulating film 27 and gate insulating film 23 and connected to the activated layer 22 in the source/drain regions, a second interlayer insulating film 29 made of a silicon nitride film and formed so as to cover an upper side of the S/D wiring 28 and the first interlayer insulating film 27, an organic flattening film 31 made of an acrylic resin-based material to flatten concave and convex portions caused by formation of various electrodes on an upper side of the second interlayer insulating film 29, a pixel electrode 32 made of a transparent ITO film housed in a contact hole 32a being opened so as to pass through the organic flattening film 31 and the second interlayer insulating film 29 and connected to the activated layer 22 functioning as the drain region and patterned for every pixel, a common electrode 33 made of a transparent ITO film formed in a manner to be parting and facing relative to the pixel electrode 32, an orientation film 34 formed on an opposite side of each of the pixel electrode 32 and common electrode 33, and liquid crystal 35 being filled between the orientation films of the pixel electrode 32 and common electrode 33.

In the TFT 20, boron is doped into the activated layer 22 functioning as the source region or drain region so that impurity concentration falls within a range of $2.5\times10^{18}/cm^3$ to $5.5\times10^{18}/cm^3$, for example, $4.0\times10^{18}/cm^3$. Moreover, the activation rate of an impurity in the activated layer is ordinarily several tens of percent (at least, 10% or more), however, the activated layer 22 of the present exemplary embodiment is formed so that the activation rate of the impurity is 1% to less than 3%, for example, a little less than 3%. In the activated film 22 of the TFT 20 of the present exemplary embodiment, impurity concentration of boron is controlled to fall within $4.0\times10^{18}/cm^3$ and, therefore, an off-leakage current in a dark state can be reduced and, since a large number of carrier combination centers exist in the film of the activated layer 22, the recombination of carriers is facilitated when while the TFT is being exposed to light, which can suppress the occurrence of the off-leakage current (hereinafter, simply a "light leakage current") at the time of irradiation of light. As a result, degradation of display image quality caused by light leakage occurring when the liquid crystal display panel 15 is driven can be prevented.

More specifically, as shown in FIG. 3, the impurity activation rate is directly proportional to the light leakage current in the source/drain regions and, therefore, as the impurity activation rate is lowered, the light leakage current decreases as well. It is thought that, in the film having a low impurity activation rate, a life of a carrier occurring at the time of light irradiation is shortened due to many failures and a large number of recombination centers in the film, which reduces the light leakage current. Thus, when the TFT 20 is used as the pixel switching element of the liquid crystal display panel 15, in order to prevent the degradation of display image quality, it is desirous that the light leakage current is controlled to be not more than $2\times10^{-11}$ (A). As is apparent from FIG. 3, the impurity activation rate has to be not more than 7%. When variations in manufacturing, it is preferable that the impurity activation rate is not more than 5%. In ordinary cases, in order to lower contact resistance or sheet resistance, the impurity activation rate is set to be several tens of percent (at least, not less than 10%). Therefore, conventionally, the reduction in the off-leakage currents in a dark and/or light leakage current occurring at the time of irradiation of light have not been taken into consideration and, as a result, such effects as described above have not been utilized.

When the case where the impurity activation rate is 1% in the source/drain regions in the activated layer 22 is compared with the case where the impurity activation rate is 3%, it is apparent from FIG. 4 that the case of the impurity activation rate of 1% is more preferable than the case of 3% in that the light leakage current can be reduced and high luminance can be simultaneously obtained. Contrarily, in the case where the impurity activation rate falls within a range of less than 1%, as shown in FIG. 5, the contact resistance between the source region or drain region and the S/D wiring 28 rises exponentially, and, therefore, it is necessary that the impurity activation rate is not less than 1%. Thus, the impurity activation rate in the activated layer 22 is preferably not less than 1% and not more than 7%, more preferably not less than 1% and not more than 5%, most preferably not less than 5% and not more than 5%.

As shown in FIG. 6, the relation between the off-leakage current or light leakage current and the impurity concentration in the source/drain regions changes greatly when the impurity concentration shown by alternating short-dashed line (L2)/long-dashed line (L1) reaches about $5.5\times10^{18}/cm^3$. That is, the off-leakage current shown by the symbol of filled squares, increases gradually as the impurity concentration of boron rises, however, when the impurity concentration becomes not less than $5.0\times10^{18}/cm^3$, the off-leakage current increases rapidly. This is because the tunneling phenomenon in a P-N junction at an end of the drain region becomes remarkable due to arise in the impurity concentration. On the other hand, the light leakage current shown by the symbol of filled circles rapidly becomes its minimum value when the impurity concentration reaches about $5.5\times10^{18}/cm^3$ and, in the region where the impurity concentration is lower than the value, as the impurity concentration becomes lower, the light leakage current increases and, in the region where the impurity concentration is higher than the value, as the impurity concentration becomes higher, the light leakage current also increases. This is because, in the region where the impurity concentration is not more than $5.5\times10^{18}/cm^3$, as the impurity concentration increases, the density of the recombination center rises which causes the light leakage current to decrease while, in the where the impurity concentration is not less than $5.5\times10^{18}/cm^3$, the increase in the light leakage current is larger than the decrease in the off-leakage current. Moreover, the short-dashed line L2 is a guide value of $2\times10^{-11}$ (A), indicating that the increase in the off-leakage current becomes larger than the decrease in the light leakage current.

In FIG. 7, the relation between impurity concentration and ON-current in the source/drain regions in the activated layer 22 is shown. As shown in FIG. 7, in the region where the impurity concentration of boron is less than $2.5\times10^{18}/cm^3$, the ON-current that has to be increased when the TFT 20 is used as a switching element begins rapidly to drop. It is, therefore, necessary that the boron concentration in the source/drain regions in the activated layer 22 is not less than $2.5\times10^{18}/cm^3$.

Thus, in order to reduce the off-leakage current and light leakage current, it is preferable that the impurity concentration in the source/drain regions in the activated layer 22 is not less than $2.5\times10^{18}/cm^3$ and not more than $5.0\times10^{18}/cm^3$.

Therefore, when the TFT 20 is used as the switching element, it is preferable that the impurity concentration is preferably not less than $2.5\times10^{18}/cm^3$ and not more than $5.0\times10^{18}/cm^3$ and that the impurity activation rate is not less than 1% and not more than 5%, more preferably not less than 1% and less than 3%. By controlling as above, the TFT 20 can reduce the off-leakage current and light leakage current, surely obtain an ON-current, and achieve ohmic contacts with the S/D wiring 28, and can be used as a driver circuit in the circuit region C or as the switching circuit in the pixel region P of the liquid crystal display panel 15.

Next, a method for manufacturing the TFT 20 is described below. According to the present exemplary embodiment, by simply setting the impurity concentration and impurity activation rate in the source/drain regions in the activated layer 22 to fall within a desired range, the TFT 20 can be manufactured without the need for greatly changing the processes themselves, thus enabling an established procedure to be applied to produce the TFT 20.

First, as shown in FIGS. 8A to 8E, a silicon oxide film is deposited on the glass substrate 21 covering both the circuit region C and pixel region P by an LPCVD (Low Pressure CVD) method using $SiH_4$ and $O_2$ or by a PECVD (Plasma Enhanced CVD) method using $SiH_4$ and $N_2O$ to form the backing protective film 26 (first process A). The TFT 20 is formed on the backing protective film 26.

Next, an amorphous silicon layer 22a with a thickness of 50 nm is deposited on the backing protective film 26 by the CVD method (first process B) and laser annealing is performed on the amorphous silicon layer 22a to change the amorphous silicon layer 22a into a polycrystalline silicon layer 22b (first process C) and then photolithography and etching treatment are carried out on the polycrystalline silicon layer 22b to form a contour of the activated layer 22 of the TFT 20 (first process D).

Figure 8A:
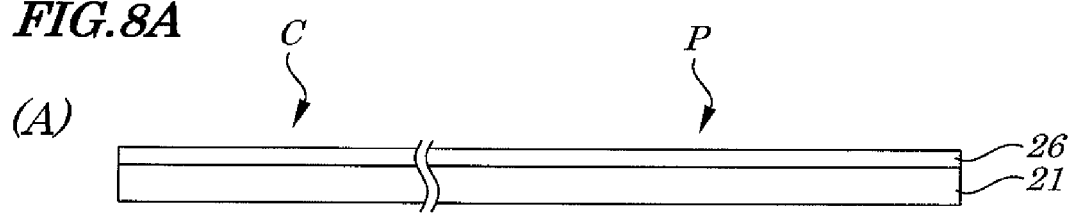
FIGS. 8A, 8B, 8C, 8D, and 8E are diagrams showing the method of manufacturing the TFT according to the first exemplary embodiment of the present invention.
Figure 8B:
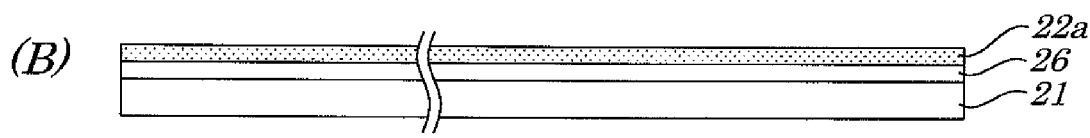
Figure 8C:
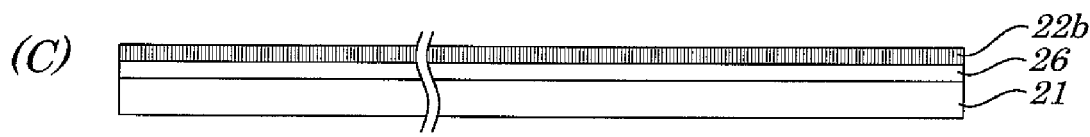
Figure 8D:
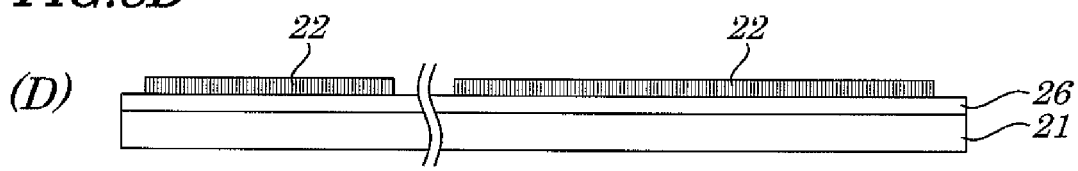
Figure 8E:
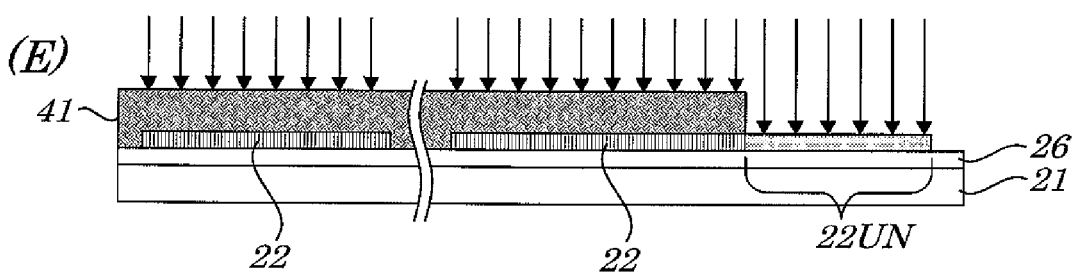

Then, as shown in FIG. 8E, on the activated layer 22, in order to form the storage capacitance lower electrode 22UN disposed adjacent to the drain region for storing electric charges required to function as the switching element on the pixel region P side, a resist 41 having a pattern having an opened region for forming the storage capacitance lower electrode 22UN is formed, and boron is implanted to be doped into the resist 41 so that its impurity concentration becomes about $2\times10^{20}/cm^3$ (first process E).

Figure 9F:
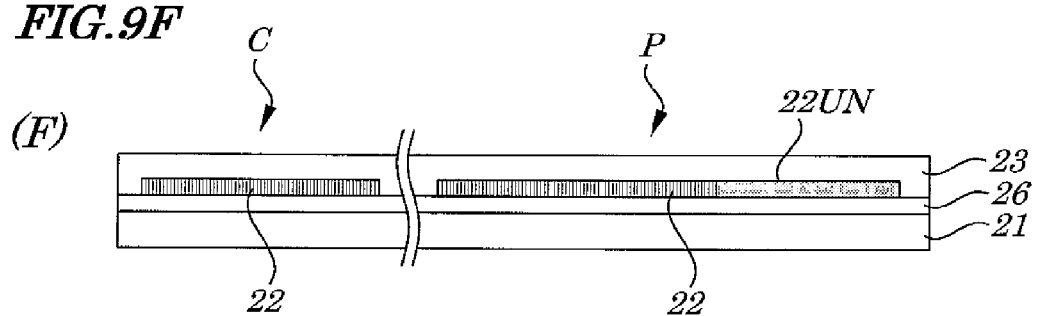
FIGS. 9F, 9G, 9H, and 9I are diagrams showing the method of manufacturing the TFT following the methods in FIG. 8E according to the first exemplary embodiment of the present invention.
Figure 9G:
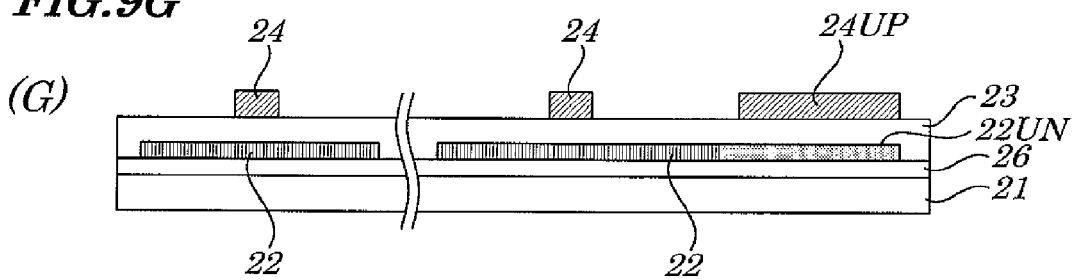

After that, as shown in FIGS. 9F, after the resist 41 is removed, a silicon oxide film with a thickness of 0.03 μm to 0.15 μm (preferably 0.12 μm) is deposited in a manner to cover the entire activated layer 22 in both the circuit region C and pixel region P to form the gate insulating film 23 (first process F). Then, as shown in FIG. 9G, after the deposition of a film made of a gate wiring materials such as Wsi, Cr, Mo, W, or the like on the gate insulating film 23, by using a patterning process, a gate wiring including the gate electrodes 24 formed in both the circuit region C and pixel region P and storage capacitance upper electrode 24UP to store electric charges between the storage capacitance upper electrode 24UP and storage capacitance lower electrode 24UN in the pixel region P are formed on the gate insulating film 23 (first process G). In the first process G, the storage capacitance upper electrode 24UP is formed in a manner in which part of the storage capacitance lower electrode 22UN to be formed in the activated layer 22 on the pixel region P side is allowed to be exposed toward the upper side.

Figure 9H:
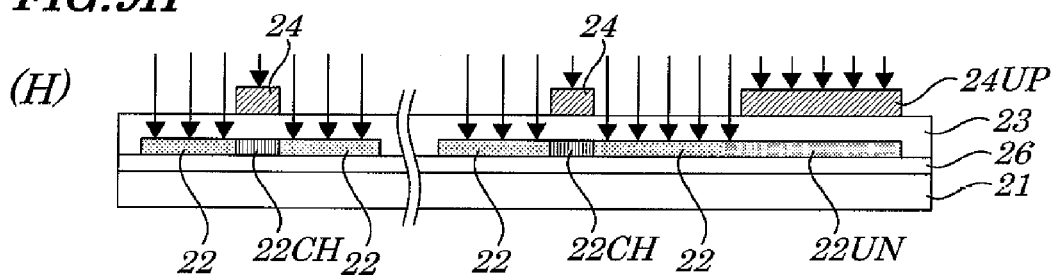

Next, as shown in FIG. 9H, in order to form the source region and drain regions of the TFT 20, boron is doped into the activated layer 22 in both the circuit region C and pixel region P so that its impurity concentration falls within a range of $5.0\times10^{18}/cm^3$ to $5.5\times10^{18}/cm^3$, for example, $4\times10^{18}/cm^3$ (first process H). In this first process H, a self-alignment process by using the gate electrode 24 and storage capacitance upper electrode 24UP as the mask is employed which enables the omission of the formation of the mask and a region facing the gate electrode 24 in the activated layer 22 is used as the channel region 22CH. Since boron is also doped into the storage capacitance lower electrode 22UN exposed from the storage capacitance upper electrode 24UP, the concentration of the impurity in the exposed region becomes the impurity concentration obtained by summing the amount of boron doped into the storage capacitance lower electrode UN and the amount of boron doped into the source and drain regions of the present TFT 20. Owing to the existence of the exposed region, the boron impurity concentration in the activated layer 22 on the drain region side and in the storage capacitance lower electrode 22UN is allowed to vary in an inclined or curved manner (allowed to be changed stepwise) to ensure an electrical junction and to prevent the occurrence of pixel defect of the liquid crystal display panel 15.

Figure 9I:
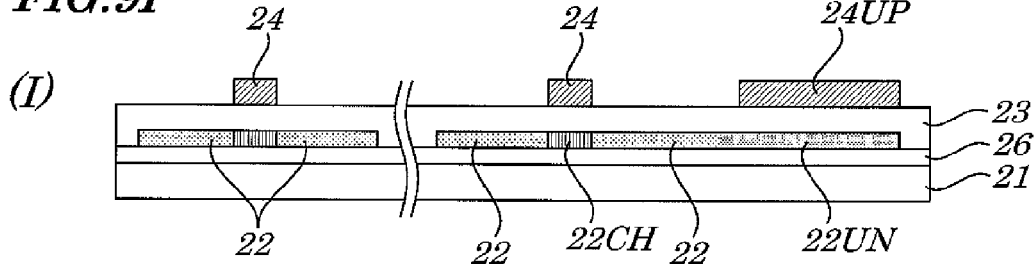

Next, as shown in FIG. 9I, in order to activate boron doped into the activated layer 22 in the circuit region C and pixel region P, the source and drain regions are heated at 450° C. for one hour (first process I). The sheet resistance value after the activation by the thermal annealing treatment in the first process I becomes about $1.5 \times 10^5 \Omega$/square (per unit area) in the source/drain regions and the boron activation rate obtained based on the sheet resistance value becomes about 3%. The impurity activation rate derived from the carrier concentration quantified by the SCM and from the impurity concentration quantified by the SIMS is also about 3%. Moreover, the activation treatment may be carried out after the formation of the first interlayer insulating film 27 to be described later.

Figure 10J:
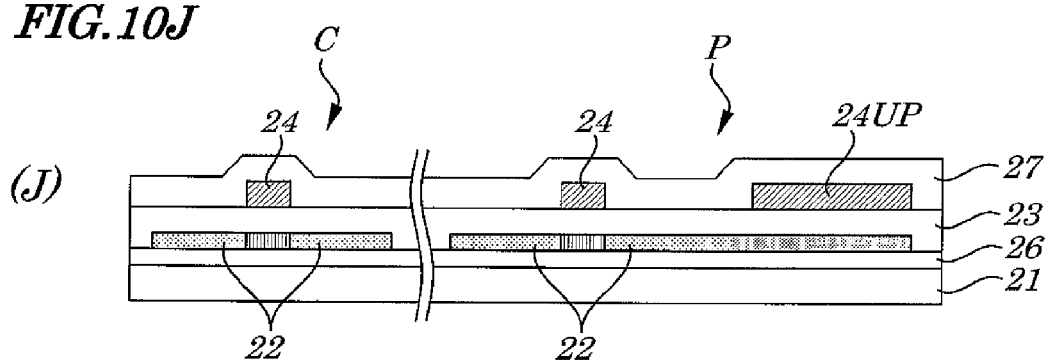
FIGS. 10J, 10K, 10L, and 10M are diagrams showing the method of manufacturing the TFT following the methods in FIGS. 9F, 9G, 9H, and 9I according to the first exemplary embodiment of the present invention.
Figure 10K:
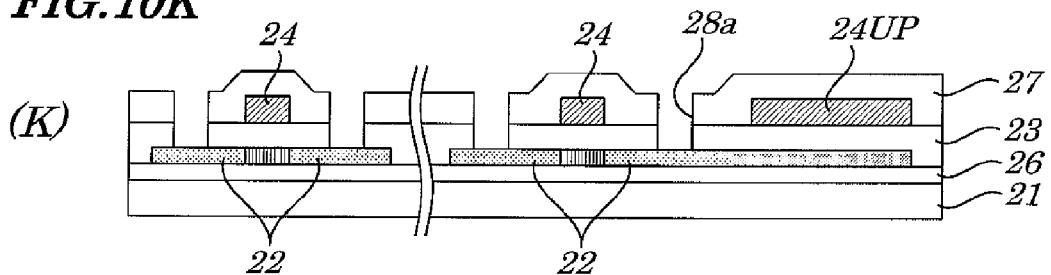
Figure 10L:
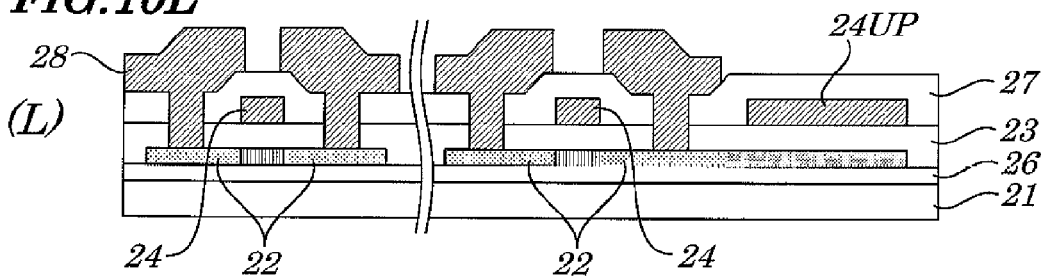
Figure 10M:
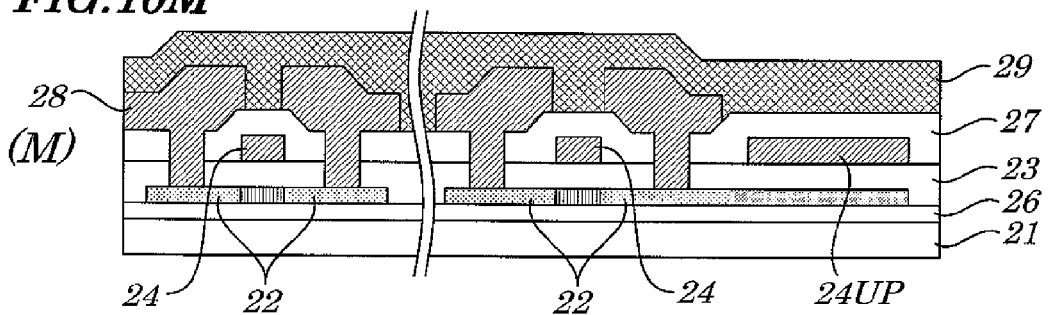

Then, as shown in FIG. 10J, a silicon oxide film with a thickness of 0.3 μm to 0.5 μm, for example, 0.4 μm is deposited by the CVD method to form the first interlayer insulating film 27 in a manner to cover the gate insulating film 23, gate electrode 24, and storage capacitance upper electrode 24UP (first process J). Next, as shown in FIG. 10K, by forming a resist to expose portions corresponding to both sides of the gate electrode 24 on the first interlayer insulating film 27 and performing etching process, a contact hole 28a passing through the first interlayer insulating film 27 and the gate insulating film 23 is formed and, as a result, the source/drain regions disposed on both sides of the channel region 22CH in the activated layer 22 are exposed (first process K). As shown in FIG. 10L, on the first interlayer insulating film 27, an Al (aluminum) film made of a low-melting metal material is deposited by a sputtering method and the contact holes are filled with the Al film and then, by performing etching and patterning, the S/D (source/drain) wiring 28 made of a metal wiring layer connected to each of the source and drain regions in the activated layer 22 (first process L). Next, as shown in FIG. 10M, to form a second interlayer insulating film 29, a silicon nitride film with a thickness of 0.4 μm is deposited by the CVD method in a manner to cover the first interlayer insulating film 27 and S/D wiring 28 (first process M).

Next, as shown in FIG. 11N, in order to flatten convex and concave portions caused by the S/D wiring 28 and other layers, the acrylic resin-based material with a thickness of about 1.2 μm is coated on the second interlayer insulating film 29 to form the organic flattening film 31 (first process N). Then, as shown in FIG. 11O, on the organic flattening film 31, by forming a resist and etching portions corresponding the S/D wiring 28 to be connected to the drain region on the storage capacitance lower electrode 22UN side in the activated layer 22, a contact hole 32a is formed so as to pass through the second interlayer insulating film 29 and the S/D wiring 28 and to expose the second interlayer insulating film 29 and the S/D wiring 28 (first process O). Then, as shown in FIG. 11P, after a transparent ITO film is deposited on the organic flattering film 31 and, on an inner face of the contact hole 32a, by sputtering, etching and patterning, the pixel electrode 32 is formed (first process P) to complete the formation of the TFT 20.

According to the method of manufacturing the TFT 20 of the first exemplary embodiment, the boron impurity concentration in the source/drain regions in the activated layer 22 is set to fall within a range of $2.5 \times 10^{18}/cm^3$ to $5.5 \times 10^{18}/cm^3$ and the impurity activation rate is set to be a little less than 3% being the best value in a range of 1% to less than 3%. Therefore, as shown in FIG. 3, the high impurity concentration causes a decrease in recombination centers in the film and a longer carrier life and, therefore, the light leakage current increases, thus causing lowering of display image quality of the liquid crystal display panel. However, according to the impurity concentration and activation rate, both the off-leakage current and light leakage current can be reduced which prevents the degradation in display image quality of the liquid crystal display panel 15 of the TFT 20.

Additionally, according to the TFT 20 of the first exemplary embodiment, in the first process H, the self-alignment process is employed in which the gate electrode 24 itself is used as the mask, and therefore, a boundary position between the source/drain regions and the channel region 22CH coincides with the position of an end portion of the gate electrode 24, thus producing no overlapped portions. Thus, in the TFT 20 of the exemplary embodiment, as shown in FIG. 12, the light leakage current can be reduced compared with a TFT having a structure in which the gate wiring including the gate electrode 24 overlaps the source/drain regions in the activated layer 22 in each of the circuit region C and pixel region P. The TFT 20 has a single-gate structure in which one gate electrode 24 is provided for the source/drain regions in the activated layer 22. It is, however, known that, in the pixel switching element using a TFT having a multi-gate structure including a double-gate structure in which two gate electrodes 24 are formed in parallel to each other as shown in FIG. 13, a triple-gate structure in which three gate electrodes are formed in parallel, and a quadrable gate in which four gate electrodes are formed in parallel, the off-leakage current decreases. It is also found that, in the case of the multi-gate structure, the light leakage current decreases as well, as shown in FIGS. 14A and 14B. This is because the strength of an electric field imposed on an end portion in the activated layer is decreased by forming the TFT having the multi-gate structure.

Figure 15A:
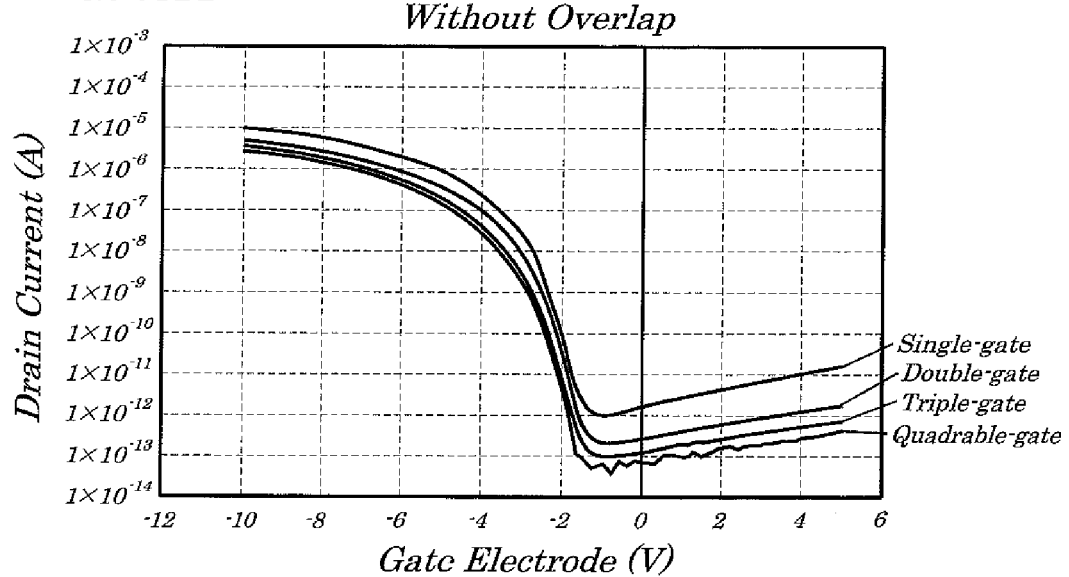
FIGS. 15A and 15B are graphs showing relations between a number of gate electrodes and drain currents corresponding to absence (FIG. 15A) or presence (FIG. 15B) of an overlapped portion explaining effects of the multi-gate structure according to the first exemplary embodiment.
Figure 15B:
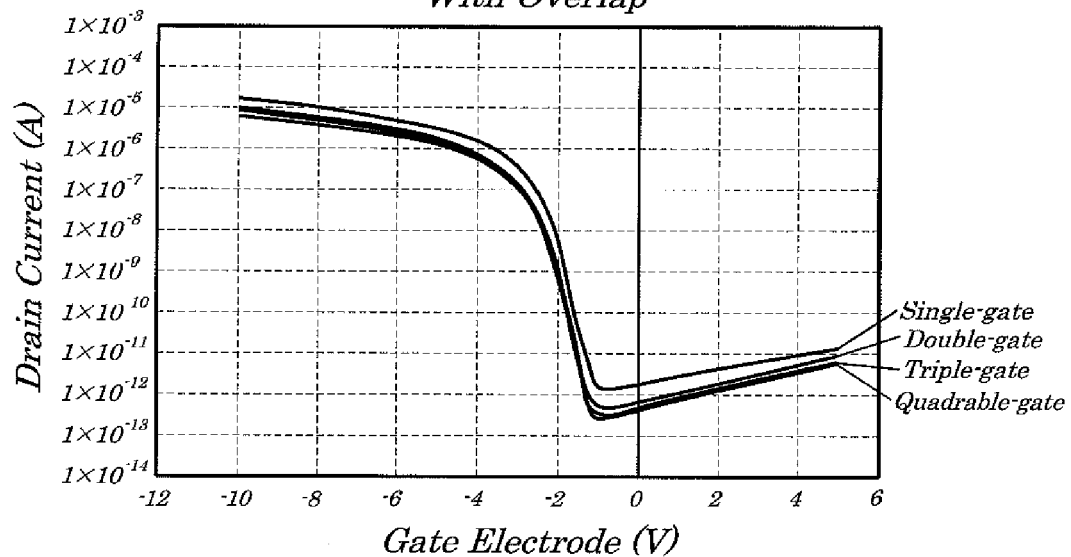

Therefore, it is though that, when the impurity activation rate in the drain region is high, a light leakage current is high and, therefore, even if an effect provided by a structure having no overlapped portion can be obtained, the effect is small. Thus, according to the TFT 20 of the present invention, the impurity activation rate in the activated layer 22 is kept at a low level, which enables a decrease in the light leakage current and, as a result, a remarkable effect from the structure having no overlapped portion can be obtained as in the case of the multi-gate structure. As shown in FIGS. 15A and 15B, which show graphs showing results based on presence or absence of overlapped portions in the gate wiring for the source/drain regions, above effects are remarkable even in the case of the multi-gate structure. That is, in the TFT 20 of the first exemplary embodiment, the source/drain regions in the activated layer 22 are not overlapped by the gate electrode 24 and, therefore, the display image quality of the liquid crystal display panel 15 can be further improved.

Thus, according to the first exemplary embodiment of the present invention, by setting the boron impurity concentration in the source/drain regions in the activated layer 22 of the TFT 20 to be $4.0 \times 10^{18}/cm^3$ in a range of $2.5 \times 10^{18}/cm^3$ to $5.5 \times 10^{18}/cm^3$ and by setting the impurity activation to be a little less than 3% being the best value in a range of 1% to less than 3%, and further by having a structure in which the source/drain regions are not overlapped by the gate current 24, both the off-leakage current and light leakage current are reduced, thereby enabling the prevention of degradation of the display image quality of the liquid crystal display panel 15.

Second Exemplary Embodiment

In the second exemplary embodiment, a structure of a liquid crystal display panel of the second exemplary embodiment used in a mobile phone is almost the same as employed in the first exemplary embodiment and, therefore, characteristic structures are described by using the same drawings used in the first exemplary embodiment.

The mobile phone (as one sample of an electronic device) described in the second exemplary embodiment, as in the case of the first exemplary embodiment, installs a liquid crystal display panel 15 having a pixel region P and circuit region C made up of a TFT 20. A thickness of a gate insulating film 23 made up of a silicon oxide film that covers an activated layer 22 functioning as a source region or drain region is not 0.12 μm as employed in the first exemplary embodiment but as thin as 0.05 μm. Therefore, in order to make the impurity concentration of boron in the activated layer 22 be $4.0 \times 10^{18}/cm^3$ as in the case of the first exemplary embodiment, a doped amount (dosage) of boron in the second exemplary embodiment is $2.0 \times 10^{13}/cm^3$, instead of $5.0 \times 10^{13}/cm^3$ used in the first exemplary embodiment.

According to the method of manufacturing the TFT 20 of the second exemplary embodiment, the silicon oxide film with a thickness of 0.05 μm, instead of the silicon oxide film with the thickness employed in the first exemplary embodiment, is deposited by the CVD method to form the gate insulating film 23 in a manner to cover the activated layer 22 in both the circuit region C and the pixel region P by the same procedure (first process F) shown in FIG. 9F (the process is called a first process F-2 in the second exemplary embodiment). After that, as in the first process G in the first exemplary embodiment, a film made of a gate wiring material such as WSi, Cr, Mo, W, or the like is deposited on the gate insulating film 23 to form the gate wiring including the gate electrode 24 in both the circuit region C and pixel region P and a storage capacitance upper electrode 24UP.

Next, as in the first process H in the first exemplary embodiment, boron in a doping amount of $2 \times 10^{13}/cm^3$ is doped into the activated layer 22 making up the source and drain regions in both the circuit region C and pixel region P so that its impurity concentration becomes about $4 \times 10^{18}/cm^3$ (first process H-2). After that, as in the first process H in the first exemplary embodiment, to activate boron doped in the activated layer 22, the source and drain regions are heated at 450° C. for one hour (first process I-2) and, thereafter, the same procedures as described in the first process I are performed also in the second exemplary embodiment.

As in the first exemplary embodiment, the sheet resistance value after the activation process in the first process I-2 becomes about $1.5 \times 10^5 \Omega$/square (per unit area) in the source/drain regions and the boron activation rate obtained based on the sheet resistance value becomes about 3%. The impurity activation rate derived from the carrier concentration quantified by the SCM and from the impurity concentration quantified by the SIMS is about 3%. Moreover, the activation treatment may be carried out after the formation of a first interlayer insulating film 27 to be described later as in the first exemplary embodiment.

Thus, according to the second exemplary embodiment, the thickness of the gate insulating film 23 is made thinner and the boron impurity concentration in the activated layer 22 making up the source/drain regions is also made as low as $4 \times 10^{18}/cm^3$ compared with the first exemplary embodiment and its activation rate is set to be 3%. As a result, in addition to effects and actions obtained by the first exemplary embodiment, in the second exemplary embodiment, an effect of enabling an operation voltage to become lower and image display to be controlled with high accuracy.

Third Exemplary Embodiment

In the third exemplary embodiment, the structure of the liquid crystal display panel of the third exemplary embodiment used in a mobile phone is almost the same as that in the first exemplary embodiment and, therefore, characteristic structures are described by using the same drawings used in the first exemplary embodiment.

The mobile phone described in the third exemplary embodiment, as in the case of the first exemplary embodiment, installs a liquid crystal display panel 15 having a circuit region C and pixel region P made up of a TFT 20. In the TFT 20, boron is doped into an activated layer 22 functioning as the source/drain regions so that its impurity concentration falls within a range of $2.5 \times 10^{18}/cm^3$ to $5.5 \times 10^{18}/cm^3$, for example, $4.0 \times 10^{18}/cm^3$. Though the activated layer 22 in the first exemplary embodiment is formed so that the boron impurity activation rate is a little less than 3%, the activated layer 22 in the third exemplary embodiment is formed, by changing its manufacturing method to the processes described later, so that its impurity activation becomes a little more than 1% in a range of 1% to less than 3% being the best value to reduce an off-leakage current and light leakage current.

In the method of manufacturing the TFT 20, the first process I shown in FIG. 9I is omitted. That is, the annealing process by which the source and drain regions are heated at 450° C. for one hour to activate boron doped into the activated layer 22 in the circuit region C and pixel region P is skipped. Then, as in the case of the first process J in the first exemplary embodiment, a silicon oxide film with a thickness of 0.3 μm to 0.5 μm, for example, 0.4 μm, is deposited by the CVD method while the glass substrate is being heated to about 350° C. to form a first interlayer insulating film 27 so as to cover the gate insulating film 23, gate electrode 24, and storage capacitance upper electrode 24UP in the circuit region C and pixel region P (first process J-3). At this point of time, the boron doped into the activated layer 22 on the glass substrate 21 is activated at the same level as is activated by the annealing process. After that, as in the first process K in the first exemplary embodiment, a contact hole 28a is formed in the first interlayer insulating film 27 and gate insulating film 23 and, thereafter, the similar processes performed in the first process K are carried out as well.

In the first exemplary embodiment, the sheet resistance of the activated layer 22 obtained after the formation of the first interlayer insulating film 27 and after the annealing process in the first process J-3 is about $1.5 \times 10^5 \Omega$/square (per unit area) and the boron impurity activation rate is a little less than 3%, however, in the third exemplary embodiment, the sheet resistance of the activated layer is $5 \times 10^5 \Omega$/square and the boron impurity activation rate is about a little more than 1%.

That is, by omitting the first process I employed in the first exemplary embodiment and by forming the first interlayer insulating film 27 and by annealing the activated layer 22 at the same time, the impurity activation rate of boron can be kept at a low level and light leakage current of the TFT 20 can be also reduced (see FIG. 4). Moreover, by omitting the high-temperature process in which, after the formation of the gate wiring in the first process G employed in the first exemplary embodiment, the substrate is heated up to not less than 400° C., a conductive material with a low heat resistance such as aluminum may be used as its gate wiring material.

Thus, in the third exemplary embodiment, an additional effect can be obtained compared with the first exemplary embodiment. That is, one of the processes employed in the first exemplary embodiment is omitted, which enables the simplification of the process and the annealing temperature for the activated layer 22 functioning as the source/drain regions can be lowered and the impurity activation rate of boron can be about 1% which enables further reduction of the light leakage current. Moreover, heat resistance temperature needed to be used for the gate wiring material containing the gate electrode 24 formed in a pre-process stage can be lowered, which enables a conductive material having a low melting point such as aluminum to be selected to improve electrical characteristics and to shorten the treatment time.

Fourth Exemplary Embodiment

Figure 16E:
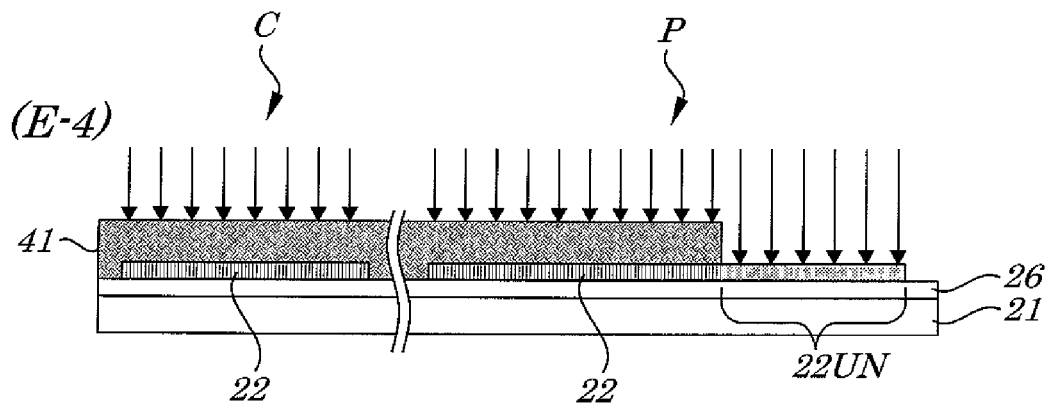
FIGS. 16E to 16H are process diagrams showing a method of manufacturing a TFT to be mounted on a liquid crystal display panel installed on a mobile phone for example according to a fourth exemplary embodiment.
Figure 16F:
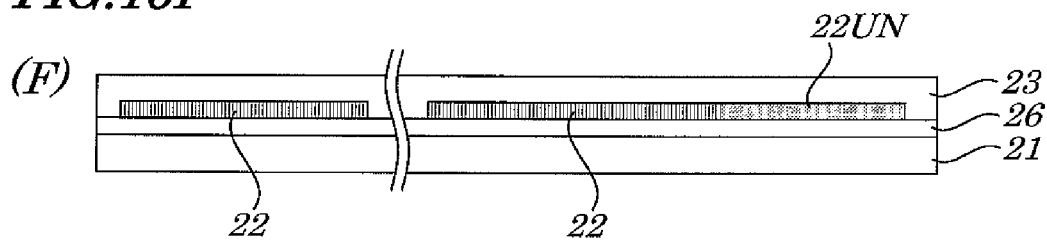
Figure 16G:
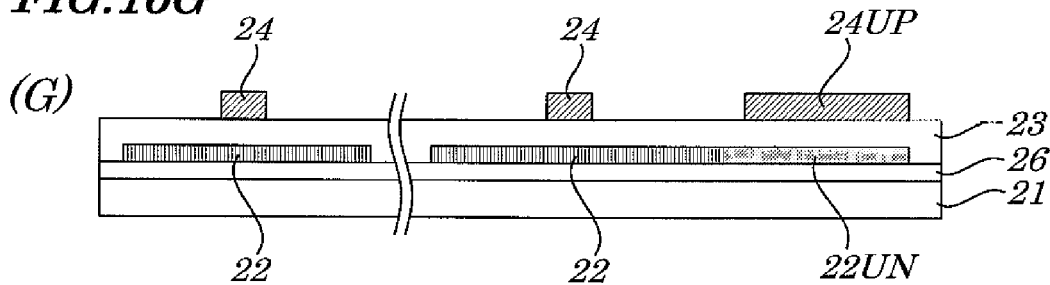
Figure 16H:
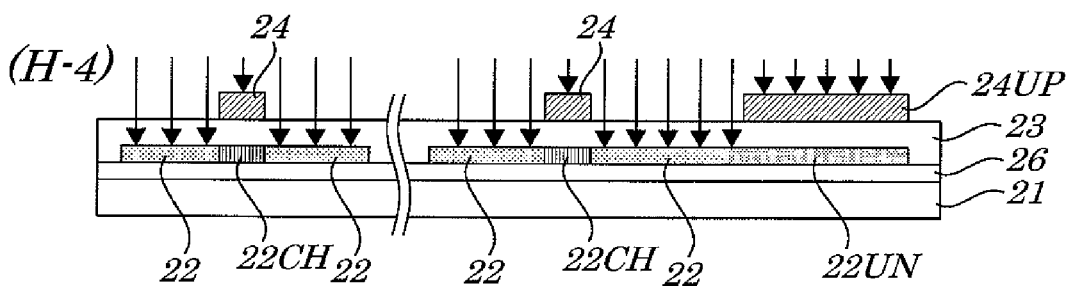
Figure 17I:
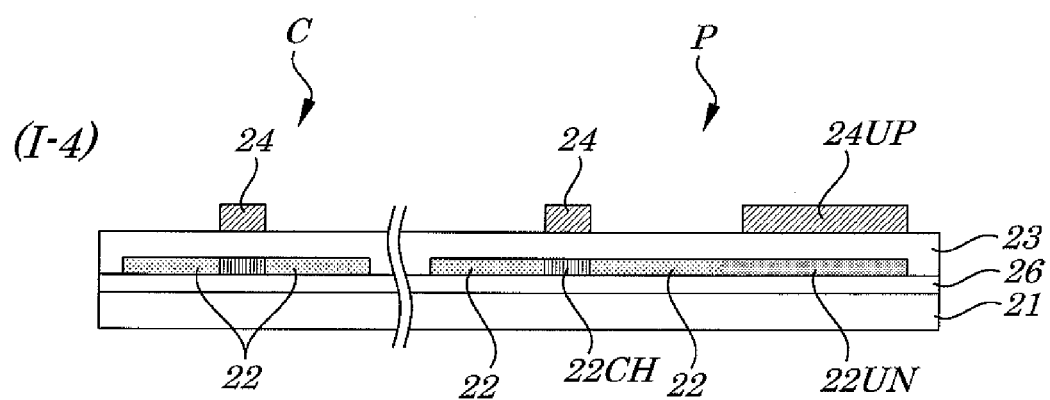
FIG. 17I is also a process diagram following processes in FIG. 16 showing the manufacturing method of the TFT according to the fourth exemplary embodiment.

FIGS. 16E to 16H are process diagrams showing a method of manufacturing a TFT to be mounted on a liquid crystal display panel installed on a mobile phone of the fourth exemplary embodiment and FIG. 17I is also a process diagram following the processes in FIG. 16H showing the manufacturing method of the TFT.

The mobile phone described in the fourth exemplary embodiment, as in the case of the first exemplary embodiment, has a liquid crystal display panel 15 made up of the TFTs 20 in a pixel region P and circuit region C and, therefore, in FIGS. 16E to 16H and FIG. 17I, same reference numbers are assigned to components having same functions as in the first exemplary embodiment except replaced drawings. The mobile phone (electronic device), as in the first exemplary embodiment, the liquid crystal display panel 15 in which a pixel region P and circuit region C are formed in a TFT 20. In the TFT 20 of the fourth exemplary embodiment, instead of boron used in the first exemplary embodiment, phosphorous is doped as an impurity into activated layers 22 functioning as the source/drain regions.

Therefore, in the method of manufacturing the TFT 20 of the fourth exemplary embodiment, phosphorous, instead of boron, is doped, however, the procedures from the first process E to the first process I in the first exemplary embodiment are used for the manufacturing the TFT 20 under the same conditions applied in the first exemplary embodiment.

Described simply, in a first process E-4 in FIG. 16, a resist is formed on the activated layers 22 in both the circuit region C and pixel region P so that a region of the storage capacitance lower electrode 22UN is opened and, then, phosphorous is doped therein so that the impurity concentration becomes about $2 \times 10^{20}/cm^3$ (first process E-4). Next, after removing a resist 41, a gate insulating film 23 made of a silicon oxide film with a thickness of 0.12 μm and formed so as to cover the entire activated layers 22 (first process F) and a film made of a gate wiring material such as Wsi, Cr, or the like is deposited on the gate insulating film 23 to form a gate wiring including the gate electrode 24 and a storage capacitance upper electrode 24UP (first process G).

Next, as in the first exemplary embodiment, in order to make the activated layers 22 in both the circuit region C and pixel region P function as the source region/drain region for the TFT 20, phosphorous in a doping amount of $5 \times 10^{13}/cm^3$ is doped in the activated layer 22 so that the impurity concentration becomes about $4 \times 10^{18}/cm^3$ (first process H-4). In the successive process, in order to activate phosphorous doped in the activated layers 22 in the circuit region C and pixel region P, the activated layers 22 are heated at 450° C. for one hour (first process I-4). Thereafter, the same procedures (first process J) as in the first exemplary embodiment are performed.

Thus, in the first exemplary embodiment, by doping boron as the impurity into the activated layer 22 of the TFT 20 in the circuit region C and pixel region P, the p-ch (p-channel) TFT is formed. However, in the fourth exemplary embodiment, by doping phosphorous as the impurity, an n-ch (n-channel) TFT having mobility being higher than that in the p-channel TFT is formed and the same effect and action as realized in the first exemplary embodiment can be achieved.

Fifth Exemplary Embodiment

Figure 18:
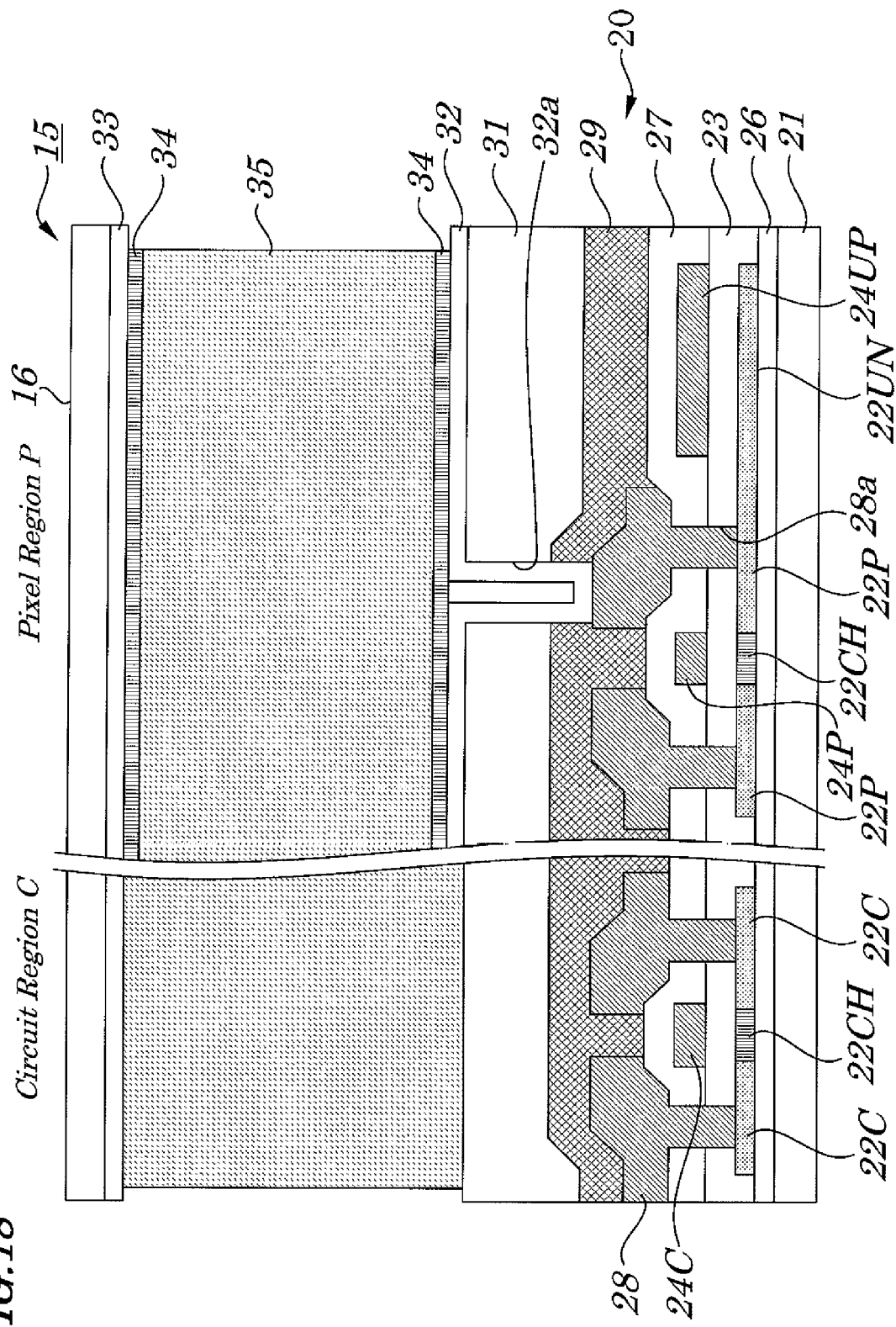
FIG. 18 is a longitudinal sectional view showing an expanded part of a TFT used in a liquid crystal display panel of a mobile phone according to a fifth exemplary embodiment.
Figure 19E:
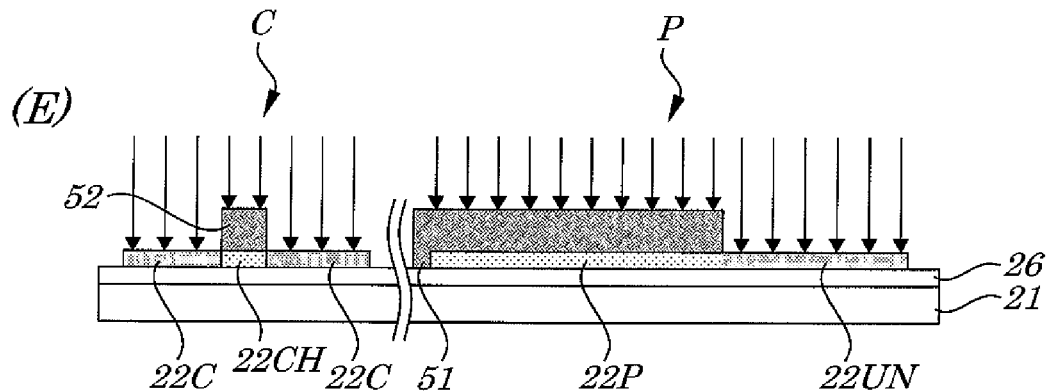
FIGS. 19E to 19H are process diagrams showing a method of manufacturing the TFT according to the fifth exemplary embodiment.
Figure 19F:
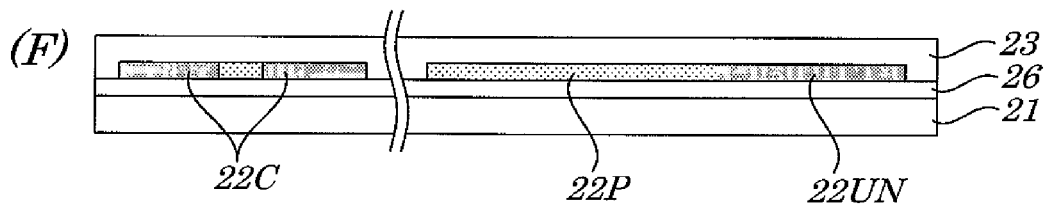
Figure 19G:
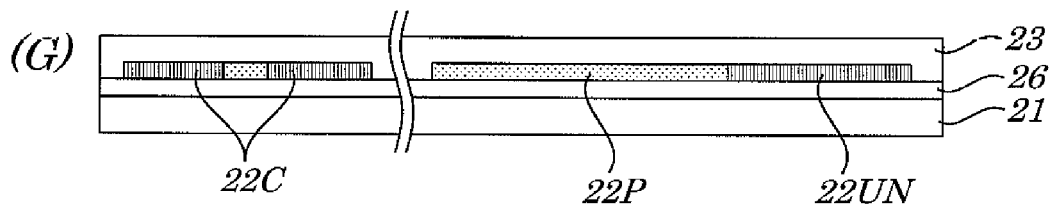
Figure 19H:
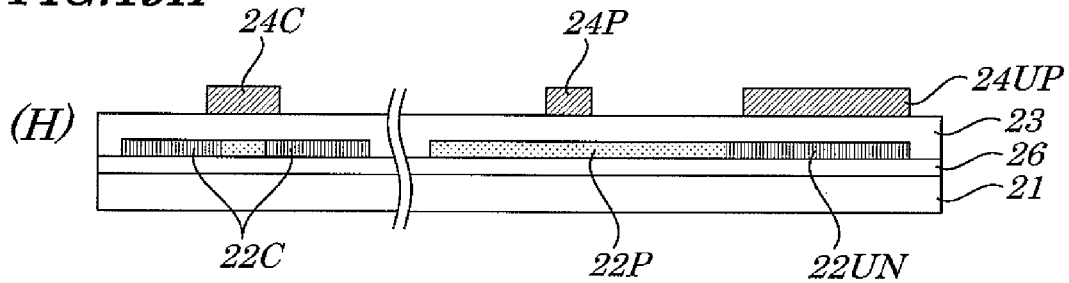

FIG. 18 is a longitudinal sectional view showing an expanded part of a TFT installed in a liquid crystal display panel making up a mobile phone of the fifth exemplary embodiment. FIGS. 19E to 19H are process diagrams showing a method of manufacturing the TFT 20. FIGS. 20I and 20J are process diagrams showing the manufacturing method following processes in FIG. 19H.

The mobile phone described in the fifth exemplary embodiment, as in the case of the first exemplary embodiment, has the liquid crystal display panel 15 having the same configuration as in the first exemplary embodiment and, therefore, in FIG. 18, FIGS. 19E to 19H, and FIGS. 20I and 20J, same reference numbers are assigned to components having same functions as in the first exemplary embodiment except replaced drawings.

The mobile phone described in the fifth exemplary embodiment, as in the case of the first exemplary embodiment, installs the liquid crystal display panel 15 having a pixel region P and circuit region C made up of the TFT 20. In the method of manufacturing the TFT 20 of the fifth exemplary embodiment, activated layers 22 (22C, 22P) respectively functions as the source region or drain region and gate electrodes 24 (24C, 24P) are different from each other for every circuit region C or pixel region P, that is, as shown in FIG. 18, one activated layer 22C is formed in the circuit region C and the other activated layer 22P is formed in the pixel region P and, similarly, the gate electrode 24C is formed in the circuit region C and gate electrode 24P is formed in the pixel region P.

In the first exemplary embodiment, boron impurity concentration of the activated layer 22 is set to be $4.0 \times 10^{18}/cm^3$ in a range of $2.5 \times 10^{18}/cm^3$ to $5.5 \times 10^{18}/cm^3$ commonly in the pixel region P, however, in the fifth exemplary embodiment, the boron impurity concentration of the activated layer 22P in the pixel region P is set to be $4.0 \times 10^{18}/cm^3$ in a range of $2.5 \times 10^{18}/cm^3$ to $5.5 \times 10^{18}/cm^3$ while the boron impurity concentration of the activated layer 22C in the circuit region C is set to be $5.0 \times 10^{18}/cm^3$ to $1.0 \times 10^{19}/cm^3$ which is a little higher than that in the pixel region. Moreover, in the first exemplary embodiment, the boron impurity activation rate of the activated layer 22P in the pixel region P is set to be a little less than 3%, however, in the fifth exemplary embodiment, the boron impurity activation rate in the activated layer 22P in the pixel region P, by changing the process of manufacturing thereof, is set to be about a little more than 1% within a range of 1% to less than 3%, which is the best for the reduction of off-leakage current and light leakage current.

In the method of manufacturing the TFT 20 of the fifth exemplary embodiment, the procedures from the first process A to first process D in the first exemplary embodiment are applied as well. That is, after a backing protective film 26 made of a silicon oxide film is formed on a glass substrate 21, an amorphous silicon layer 22 is formed on the backing protective film 26 to form a polycrystalline silicon film 22b. The polycrystalline silicon 22b is formed on each of the activated layers 22P and 22C respectively in the pixel region P and circuit region C of the TFT 20.

After that, a resist 51 is formed on the activated layer 22P in the pixel region P, which has a pattern allowing a region for forming the storage capacitance lower electrode 22UN to be opened in order to form the storage capacitance lower electrode 22UN on the pixel region P side. On the activated layer 22 in the circuit region C is formed a resist 52 having a pattern for allowing the source/drain regions to be opened, that is, allowing the region for the formation of the channel region 22CH to be covered. After the formation of the resists 51 and 52, boron is doped into the resists 51 and 52 so that the impurity concentration becomes, for example, $4 \times 10^{18}/cm^3$ in a range of $3.0 \times 10^{18}/cm^3$ to $5.5 \times 10^{18}/cm^3$ (second process E, first process E and first process H are partially changed).

Next, after removing the resists 51 and 52, a silicon oxide film with a thickness of, for example, 0.12 μm in a range of 0.03 μm to 0.15 μm is deposited by the CVD method to cover the entire activated layers 22C and 22P respectively in the circuit region C and pixel region P.

Next, in order to activate boron doped into the activated layer 22C in the circuit region C and the activated layer 22P in the pixel region P, the activated layer 22C is heated at 450° C. for one hour (second process G, equivalent to first process I). In this second process G, similarly, the sheet resistance in the source/drain regions after the activation process is about $1.5 \times 10^5 \Omega$/square (per unit area) and the impurity activation calculated from the sheet resistance of boron is about 3%.

Next, on the gate insulating film 23 is deposited a film made of a gate wiring material such as WSi, Cr, Mo, W, Al, or the like and, a gate wiring including the gate electrode 24C in the circuit region C and the gate electrode 24P in the pixel region P and a storage capacitance upper electrode 24UP which stores electric charges together with a storage capacitance lower electrode 24UN are formed, by patterning the above-mentioned film (second process H, being equivalent to first process G).

In the second process H, the storage capacitance upper electrode 24UP is formed in a manner in which part of the storage capacitance lower electrode 22UN to be formed in the activated layer 22 on the pixel region P side is allowed to be exposed toward the upper side. Moreover, in the second process H, the gate electrode 24P being larger in size than the channel region CH in the activated layer 22 is formed as the gate electrode 24C in the circuit region C.

Next, in order to make the activated layer 22C in the circuit region C and the activated layer 22P in the pixel region P function as the source region and drain region of the TFT 20, especially, so that the boron impurity concentration in the source/drain regions in the activated layer 22P in the pixel region P becomes within a range of $2.5 \times 10^{18}/cm^3$ to $5.5 \times 10^{18}/cm^3$, a doping amount of boron is adjusted depending on a thickness of the gate insulating film 23. More specifically, when the thickness of the gate insulating film 23 is 0.03 μm to 0.08 μm, boron in a doping amount of $1 \times 10^{13}/cm^3$ to $5 \times 10^{13}/cm^3$ is doped and, when the thickness of the gate insulating film 23 is 0.08 μm to 0.15 μm, boron in a doping amount of $3 \times 10^{13}/cm^3$ to $8 \times 10^{13}/cm^3$ is doped. For example, when the thickness of the gate insulating film 23 is 0.12 μm, boron in a doping amount of $5 \times 10^{13}/cm^3$ is doped so that the boron impurity concentration becomes about $4 \times 10^{18}$/cm3 (second process I, being equivalent to first process H). In this second process I, a self-alignment process is employed in which the gate electrodes 24C and 24P and the storage capacitance upper electrode 24UP are used as a mask and the mask formation can be omitted accordingly.

At this time, since boron is implanted into the storage capacitance lower electrode 22UN exposed from the storage capacitance upper electrode 24UP, the impurity (boron) concentration in this exposed region is the sum of a doping amount of boron implanted into the storage capacitance lower electrode UN and into the source and drain regions of the TFT of the exemplary embodiment. Owing to the existence of the exposed region, the boron impurity concentration between the concentrations in the drain region in the activated layer 22P in the pixel region P of the TFT and the storage capacitance lower electrode 22UN is allowed to vary in an inclined or curved manner (allowed to be changed stepwise) to ensure an electrical junction and to prevent the occurrence of pixel defect of the liquid crystal panel 15.

Moreover, after boron is doped into the source/drain regions of the activated layer 22C in the circuit region C, each of which is formed adjacent to the channel region CH so that its impurity concentration becomes about $4 \times 10^{18}/cm^3$ in the second process E, in the second process I, boron in a doping amount of $5 \times 10^{13}/cm^3$ is further doped into the source/drain regions of the activated layer 22C with a little larger gate electrode 24C being used as a mask. Therefore, in the source/drain regions of the activated layer 22, the impurity concentration of boron is allowed to vary in an inclined manner to ensure an electrical junction, which enables the prevention of a pixel defect of the liquid crystal display panel. Boron is doped, by two-stage processes, into the source/drain regions of the activated layer 22C in the circuit region C and, in the first-stage process, even when the region of boron doped in the first-stage process and activated by the doping is deviated, by forming the gate electrode to be a little large, overlapped portions are formed, which enables the gate electrode 24 to function effectively. After the source/drain regions of the activated layer 22 in the circuit region C, each of which is formed adjacent to the channel region CH, are doped, in advance, with boron so that its impurity concentration falls within a range of $3.0 \times 10^{18}/cm^3$ to $5.5 \times 10^{18}/cm^3$ in the second process E, further in the second process I, the source/drain regions are doped with boron in a doping amount of $1 \times 10^{13}/cm^3$ to $8 \times 10^{13}/cm^3$ and, therefore, the impurity concentration of the source/drain regions falls within a range of $5.0\times10^{18}/cm^3$ to $1.0\times10^{19}/cm^3$ and its impurity activation rate is 3% to 5%.

After that, a silicon oxide film with a thickness of 0.3 μm to 0.5 μm, for example, 0.4 μm is deposited thereon, in a manner to cover the gate insulating film 23, gate electrodes 24C and 24P, and storage capacitance upper electrode 25UP in the circuit region C and pixel region P to form a first interlayer insulating film 27 (second process J, equivalent to first process J). At this point of time, as in the third exemplary embodiment, there is no need for the annealing process as the activation procedure of boron impurity added in the second process I; that is, by depositing the silicon oxide film by the CVD method to be used as the first interlayer insulating film 27 while heating is performed on the substrate at a temperature in a range of 300° C. to 400° C., for example, at about 350° C., the activation of boron can be achieved. In the first exemplary embodiment, the sheet resistance value after the activation by the thermal annealing treatment in the first process I in the activated layer 22 is about $1.5\times10^5$Ω/square (per unit area) and the boron activation rate calculated based on the sheet resistance value becomes a little less than 3%.

However, in the second process of the fifth exemplary embodiment, the sheet resistance value in the activated layer 22P in the pixel region P is about $5\times10^5$Ω/square (per unit area) and the boron activation rate becomes a little more than 3%. Thereafter, the same procedures (first process K) as in the first exemplary embodiment are performed.

That is, as in the third exemplary embodiment, by omitting the first process I employed in the first exemplary embodiment and by simultaneously performing the formation of the first interlayer insulting film 27 in the second process J and annealing processes, the boron impurity activation rate in the activated layer 22P in the pixel region P can be kept at a low level which enables the reduction in the light leakage current in the TFT 20 (see FIG. 4). Moreover, in the second process H, by omitting the high-temperature process of heating the substance up to 400° C. or more, it is made possible to selectively use a low heat-resistant conductive material such as aluminum or the like as the gate wiring material.

By making the impurity concentration fall within a range of $5.0\times10^{18}/cm^3$ to $5.5\times10^{18}/cm^3$ in the source/drain regions of the activated layer 22P in the pixel region P and by setting the impurity activation target of 1% to 5%, the reduction in the off-leakage current and light leakage current can be realized. On the other hand, by making the impurity concentration fall within a range of as high as $5.0\times10^{18}/cm^3$ to $1.0\times10^{19}/cm^3$ in the source/drain regions of the activated layer 22C in the circuit region C and making the impurity activation rate be 3% to 5%, the reduction in the off-leakage current and light leakage current can be achieved to some extent and, simultaneously, the ON-current required in the pixel region P and circuit region C and also required to be high when used as the switching element can be set to be slightly high (see FIG. 7).

Thus, according to the fifth exemplary embodiment, the same effect as achieved in the first exemplary embodiment can be also obtained and, additionally, since one process out of processes employed in the first exemplary embodiment is omitted in the fifth exemplary embodiment which provides an advantage of simplification of the processes. Therefore, the annealing temperature for the activated layer 22P functioning as the source/drain regions in the pixel region P is allowed to be lowered, thereby enabling the boron impurity activation rate to be about 1% and the reduction in the light leakage current to be achieved. Further, the heat-resistant temperature required for the gate wiring material including the gate electrode 24 formed in the pre-process stage can be lowered, which also enables selective use of the low heat-resistant conductive material such as aluminum and improvement of electrical characteristics of the TFT 20 and shortening of time for treatment. Moreover, the boron impurity concentration of the activated layer 22C functioning as the source/drain regions in the circuit region C can be set to be a little higher than the impurity concentration in the pixel region P and the ON-current value can be set to be a little higher, and the impurity concentration and/or impurity activation of the activated layers 22C and 22P in the pixel region P and circuit region C are not uniformly but variously handled depending on required characteristics, which enables the fitted allotment of characteristics to each region of the activated layers 22C and 22P.

While the invention has been particularly shown and described with reference to exemplary embodiments thereof, the invention is not limited to these exemplary embodiments. For example, as described as above, the present invention can be applied not only to a single-gate structure but also to a multi-gate structure.

Figure 21:
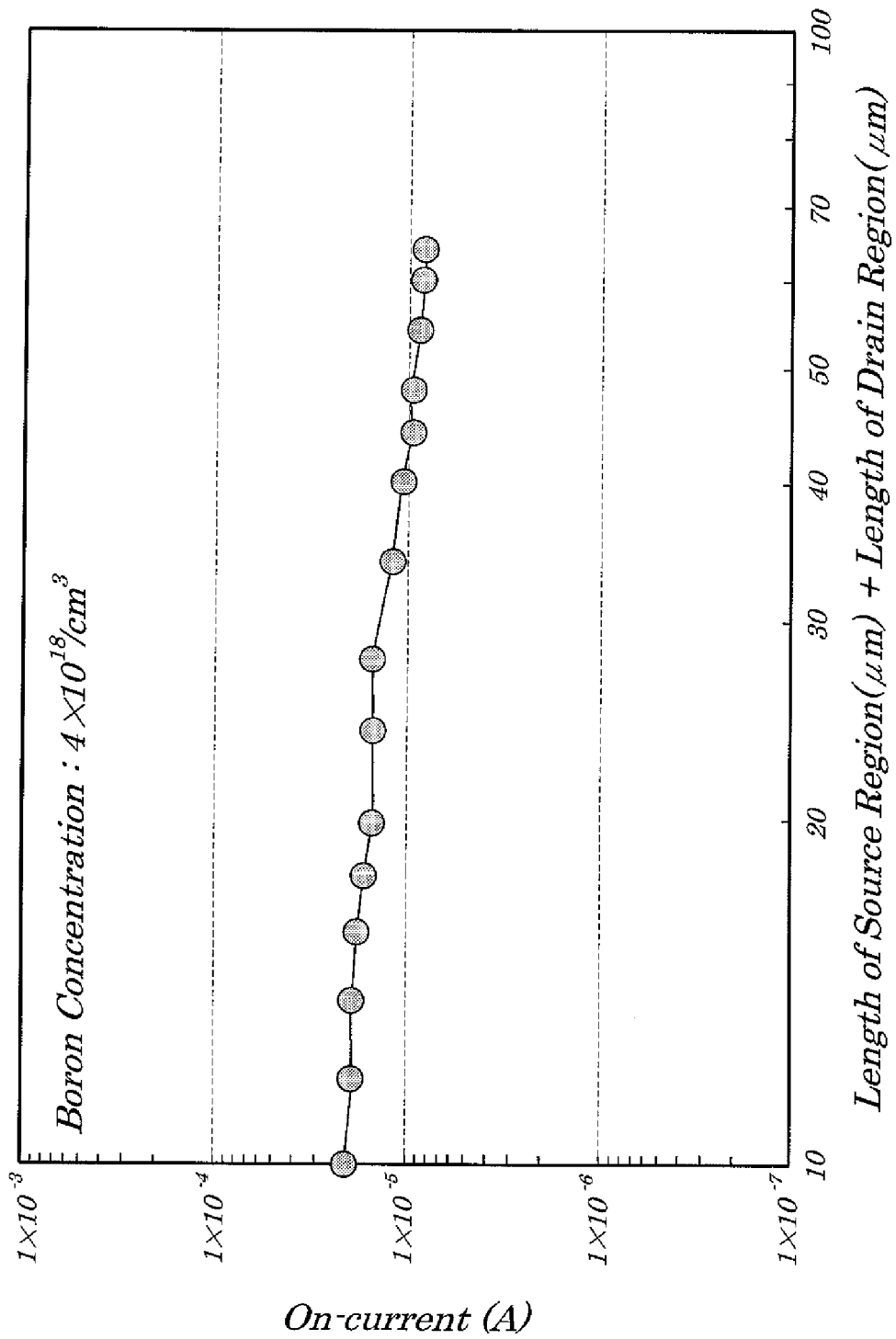
FIG. 21 is a graph showing a relation between a length of source/drain regions and ON-current of a TFT explaining the present invention.
Figure 22:
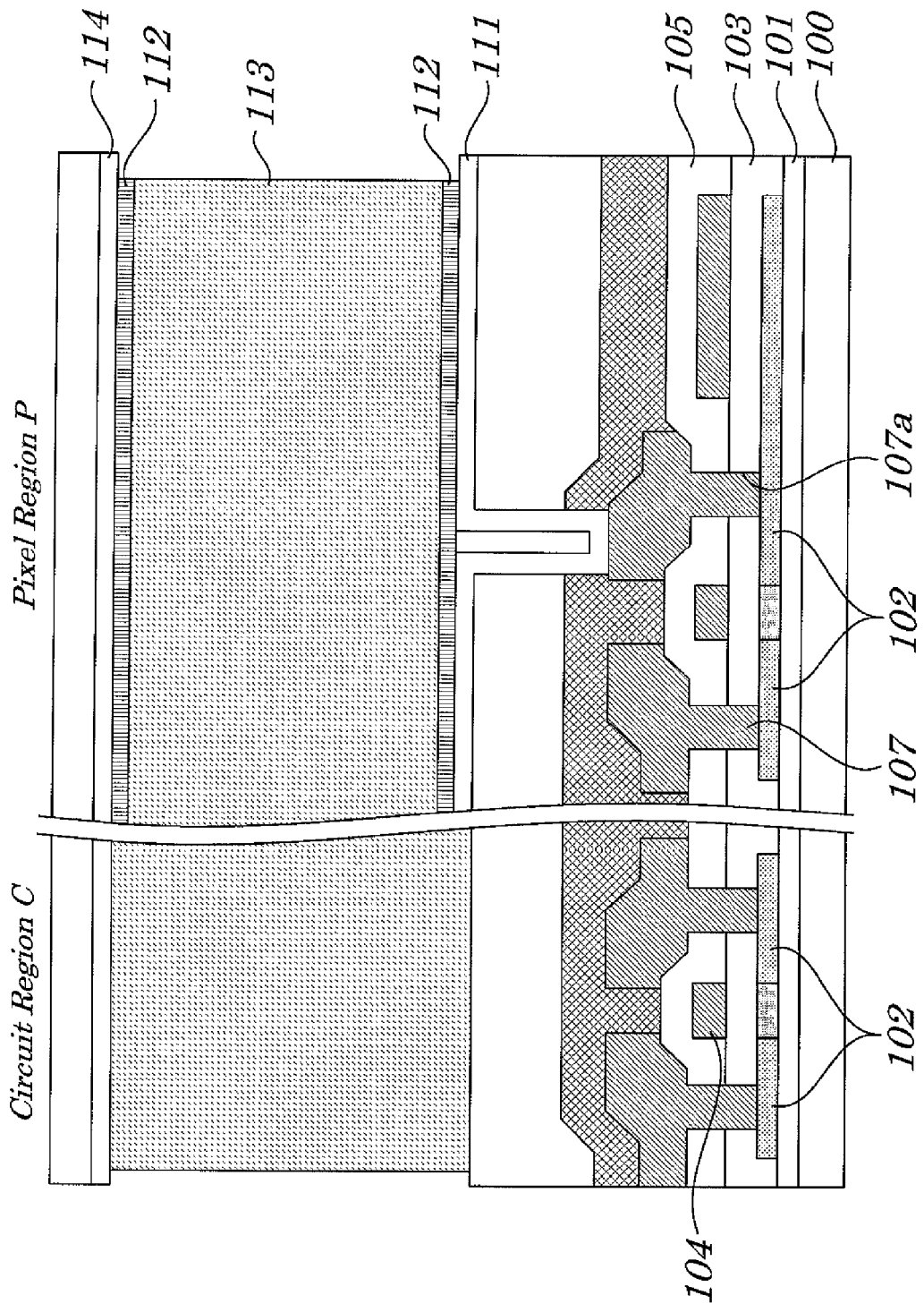
FIG. 22 is a longitudinal section of a expanded part of a TFT in a circuit region and a pixel region to be installed in a liquid crystal display panel (technological related art of the present invention) mounted in a mobile phone.

Moreover, in characteristics of the TFT 20, as shown in FIG. 21, dependence of the ON-current on a length of the source/drain regions of the activated layer 22 is small and even when the total length of a source region length and a drain region length changes from 10 μm to 20 μm, the ON-current changes only 30%. Therefore, in the manufacturing method of the TFT 20, a method of manufacturing even having low working accuracy can be applied to the formation process of the source/drain regions of the activated layer 22. When the total of the source/drain regions is about 20 μm, the change rate of the ON-current is about 30% and, therefore, the working accuracy may be set depending on the change rate of allowable ON-current.

The present invention can be applied not only to a mobile phone but also to a display device mounted on portable electronic terminals such as a PDA (personal digital assistant), personal television set, game machine, digital camera, digital video camera, notebook personal computer and a like. Moreover, the present invention can be widely applied not only to portable-type devices, but also to various fixed-type devices such as cash dispensers, automatic selling machines, monitors, and television receivers and to display devices mounted on a transmission-type LCDs, reflection-type LCDs, organic EL displays, and electronic paper.

What is claimed is:

1. A thin film transistor comprising:
   a semiconductor layer formed on a substrate, said semiconductor layer comprising a polycrystalline semiconductor;
   a gate electrode formed on said semiconductor layer with a gate insulating film interposed between said semiconductor layer and said gate electrode; and
   source/drain regions, doped with an impurity, formed in said semiconductor layer with said gate electrode being sandwiched between said source/drain regions,
   wherein an impurity concentration is uniformly distributed over all of said source/drain regions within a range of $2.5\times10^{18}/cm^3$ to $5.5\times10^{18}/cm^3$, all of the source and drain regions being defined as an entire region at least from each of both ends of said gate electrode to a corresponding one of a plurality of contact regions being in contact with source/drain wirings,
   wherein contact resistance values at said contact regions each are greater than 40,000Ω and less than 360,000Ω, the contact resistance values resulting from contact of said source/drain regions with said source/drain wirings, and wherein sheet resistance values of said source/drain regions each are greater than $1.5\times10^5\Omega$/square and less than $5\times10^5\Omega$/square.

2. The thin film transistor according to claim 1, wherein said semiconductor layer is a polycrystalline silicon film.

3. The thin film transistor according to claim 1, wherein an activation rate of said impurity is uniformly distributed over all of said source/drain regions within a range of 1% to 3%.

4. The thin film transistor according to claim 1, wherein boron or phosphorous is used as said impurity to be doped into said source/drain regions.

5. The thin film transistor according to claim 1, wherein a plurality of gate electrodes is arranged in parallel and all of said plurality of gate electrodes are connected to a common gate wiring.

6. A liquid crystal display panel comprising a thin film transistor of claim 1.

7. An electronic device comprising:
a thin film transistor, said thin film transistor comprising:
  a polycrystalline semiconductor layer formed on a substrate;
  a gate electrode formed on said polycrystalline semiconductor layer with a gate insulating film interposed between said polycrystalline semiconductor layer and said gate electrode; and
  source/drain regions, doped with an impurity, formed in said polycrystalline semiconductor layer with said gate electrode being sandwiched between said source/drain regions, wherein an impurity concentration is uniformly distributed over all of said source/drain regions within a range of $2.5\times10^{18}$/cm$^3$ to $5.5\times10^{18}$/cm$^3$, all of the source and drain regions being defined as an entire region at least from each of both ends of said gate electrode to a corresponding one of a plurality of contact regions being in contact with source/drain wirings, wherein contact resistance values at said contact regions each are greater than 40,000$\Omega$ and less than 360,000$\Omega$, the contact resistance values resulting from contact of said source/drain regions with said source/drain wirings, and wherein sheet resistance values of said source/drain regions each are greater than $1.5\times10^5\Omega$/square and less than $5\times10^5\Omega$/square.

* * * * *